(12) United States Patent
Kusano

(10) Patent No.: US 9,571,777 B2
(45) Date of Patent: Feb. 14, 2017

(54) ANALOG/DIGITAL CONVERTER AND SOLID-STATE IMAGING DEVICE

(71) Applicant: OLYMPUS CORPORATION, Tokyo (JP)

(72) Inventor: Yosuke Kusano, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/968,048

(22) Filed: Dec. 14, 2015

(65) Prior Publication Data

US 2016/0100115 A1  Apr. 7, 2016

Related U.S. Application Data

(63) Continuation of application No. PCT/JP2014/064313, filed on May 29, 2014.

(30) Foreign Application Priority Data

Jun. 27, 2013  (JP) ................................. 2013-135459

(51) Int. Cl.
    *H03M 1/56* (2006.01)
    *H04N 5/378* (2011.01)
    (Continued)

(52) U.S. Cl.
    CPC ........ *H04N 5/378* (2013.01); *H01L 27/14643* (2013.01); *H03K 4/08* (2013.01); *H03M 1/0607* (2013.01); *H03M 1/1245* (2013.01); *H03M 1/56* (2013.01); *H04N 5/37455* (2013.01); *H03M 1/123* (2013.01)

(58) Field of Classification Search
    CPC .... H03M 1/00; H03M 1/1245; H03M 1/0607; H03M 1/56; H03M 1/123; H03M 1/34; H03M 2201/11; H03K 4/08; H01L 27/14643; H04N 5/37455; H04N 5/378; H04N 5/3698; H04N 5/3765; H04N 3/155; H04N 5/23241; H04N 5/335; H04N 5/3742; H04N 3/227; H04N 5/12; H04N 5/126; H04N 5/365
    (Continued)

(56) References Cited

U.S. PATENT DOCUMENTS 3,683,369 A * 8/1972 Stern ....................... H03M 1/00
                                                    341/118
6,867,804 B1 * 3/2005 Kim ....................... H03M 1/123
                                                    341/155
(Continued)

FOREIGN PATENT DOCUMENTS

JP  2008-118634      5/2008
JP  2010-251957 A   11/2010
JP    4655500 B2    3/2011

OTHER PUBLICATIONS

International Search Report dated Aug. 19, 2014, issued in counterpart application No. PCT/JP2014/064313 (2 Pages), w/English translation.

*Primary Examiner* — Jean B Jeanglaude
(74) *Attorney, Agent, or Firm* — Westerman, Hattori, Daniels & Adrian, LLP

(57) ABSTRACT

An analog/digital converter includes: a ramp signal generation circuit that generates a ramp signal; a comparison circuit that compares potential of an input analog signal with potential of the ramp signal and outputs a comparator output signal if the potential of the ramp signal satisfies the predetermined condition; a count control circuit that divides a predetermined ramp period in which the ramp signal generation circuit outputs the ramp signal into a predetermined number n of divided ramp periods and outputs a count-stop signal; a counter circuit that counts time in the divided ramp period and outputs a count value of the counted time; and a decoder circuit that generates a digital signal according to a count value and a digital value corresponding to any one of the divided ramp periods in which the counter circuit has started counting of time and outputs the generated digital signal.

7 Claims, 10 Drawing Sheets

(51) Int. Cl.
  *H04N 5/3745* (2011.01)
  *H01L 27/146* (2006.01)
  *H03K 4/08* (2006.01)
  *H03M 1/06* (2006.01)
  *H03M 1/12* (2006.01)
(58) Field of Classification Search
  USPC .......................................... 341/155, 118, 169
  See application file for complete search history.

(56) References Cited

U.S. PATENT DOCUMENTS

| | | | | |
|---|---|---|---|---|
| 7,923,674 B2* | 4/2011 | Kagawa | ............ | H01L 27/14609 250/208.1 |
| 8,130,125 B2* | 3/2012 | Hoshino | ............. | H03M 1/0607 341/122 |
| 8,279,311 B2* | 10/2012 | Lim | ....................... | G11C 5/147 341/155 |
| 8,354,630 B2* | 1/2013 | Hoshino | ............... | H03M 1/144 250/208.1 |
| 8,395,539 B2* | 3/2013 | Lim | .................... | H03M 1/0607 341/155 |
| 2008/0135729 A1 | 6/2008 | Taura | | |
| 2009/0040352 A1* | 2/2009 | Kawaguchi | ............. | G06F 3/044 348/308 |
| 2010/0259660 A1 | 10/2010 | Kukita | | |
| 2012/0176523 A1* | 7/2012 | Yoo | ........................ | H04N 5/378 348/301 |

* cited by examiner

FIG. 3

| Dstp | Doff |
|------|------|
| 0    | 48   |
| 1    | 112  |

$\cdots (127+1) \times (0+1)/2 - (15+1) = 128 \times 1/2 - 16$ $\cdots (127+1) \times (1+1)/2 - (15+1) = 128 \times 2/2 - 16$

FIG. 7

| Dstp | Doff |
|---|---|
| 0 | 16 |
| 1 | 48 |
| 2 | 80 |
| 3 | 112 |

⋯ (127+1) × (0+1)/4−(15+1)=128×1/4−16
⋯ (127+1) × (1+1)/4−(15+1)=128×2/4−16
⋯ (127+1) × (2+1)/4−(15+1)=128×3/4−16
⋯ (127+1) × (3+1)/4−(15+1)=128×4/4−16

ANALOG/DIGITAL CONVERTER AND SOLID-STATE IMAGING DEVICE

CROSS REFERENCE TO RELATED APPLICATIONS

This application is a continuation application based on a PCT Patent Application No. PCT/JP2014/064313, filed May 29, 2014, whose priority is claimed on Japanese Patent Application No. 2013-135459, filed Jun. 27, 2013, the entire content of which are hereby incorporated by reference.

BACKGROUND OF THE INVENTION

Field of the Invention

The present invention relates to an analog/digital converter and a solid-state imaging device.

Description of the Related Art

In recent years, a complementary metal oxide semiconductor (CMOS) image sensor has gathered attention as a solid-state imaging device and has been practically used. The CMOS image sensor can be manufactured using an ordinary semiconductor manufacturing process, whereas a charge coupled device (CCD) image sensor is manufactured using a dedicated manufacturing process. Thus, a multi-functional CMOS image sensor can be realized by incorporating various functional circuits in the sensor, for example, as a system-on chip (SOC).

In recent years, there is an increasing number of examples of a solid-state imaging device including an analog/digital converter (hereinafter referred to as an "A/D conversion circuit") as a solid-state imaging device mounted on a digital camera, a digital video camera, or an endoscope. A single-slope A/D conversion circuit which uses ramp waves is used as an A/D conversion circuit included in such a solid-state imaging device. The single-slope A/D conversion circuit is provided in each column of a solid-state imaging device to form a single-slope column A/D conversion circuit (for example, see Japanese Patent No. 4655500). In the following description, an A/D conversion circuit is assumed to indicate a single-slope A/D conversion circuit.

FIG. 9 is a block diagram showing a schematic configuration of a conventional solid-state imaging device. A conventional solid-state imaging device 600 shown in FIG. 9 includes a vertical scanning circuit 601, a pixel array portion 602, an analog signal processing circuit 603, a ramp signal generation circuit (hereinafter referred to as "DAC") 604, a column A/D conversion circuit 605, a horizontal scanning circuit 606, and a control circuit 607.

The solid-state imaging device 600 removes noise from pixel signals output from respective pixels 61 in the pixel array portion 602, converts analog signals Vin obtained after the noise removal to digital signals Dout with the aid of A/D conversion circuits 609 provided in the column A/D conversion circuit 605, and sequentially outputs the digital signals Dout.

The vertical scanning circuit 601 selects the pixels 61 in the pixel array portion 602 disposed in each row of the pixel array portion 602 respectively according to a control signal input from the control circuit 607 and outputs pixel signals generated by the respective pixels 61 of the selected row to the analog signal processing circuit 603. In the following description, a period of time from a certain row of the pixel array portion 602 being selected to the next row being selected is referred to as a "horizontal period".

The pixel array portion 602 is a pixel array in which a plurality of pixels 61 are disposed 2-dimensionally in row and column directions. Each of the pixels 61 includes a photodiode, and the photodiode provided in the pixel 61 generates a pixel signal corresponding to the amount of light which is incident in a certain storage period. The pixel array portion 602 outputs a pixel signal generated by the selected pixel 61 to the analog signal processing circuit 603 according to the selection from the vertical scanning circuit 601.

The analog signal processing circuit 603 removes reset noise and 1/f noise from the pixel signal input from the pixel array portion 602 according to the control signal input from the control circuit 607 and amplifies the pixel signal obtained after the noise removal. The analog signal processing circuit 603 outputs the amplified pixel signal to the column A/D conversion circuit 605 as the analog signal Vin.

The DAC 604 generates a ramp wave Vramp, which is an analog signal of which the potential decreases with time at a certain rate in each horizontal period according to the control signal input from the control circuit 607, and outputs the generated ramp wave Vramp to the column A/D conversion circuit 605.

The control circuit 607 outputs a control signal configured to control the driving of the vertical scanning circuit 601, the analog signal processing circuit 603, the DAC 604, and the horizontal scanning circuit 606.

The column A/D conversion circuit 605 includes a number of A/D conversion circuits 609 corresponding to the number of columns of the pixels 61 disposed in the pixel array portion 602 each of the A/D conversion circuits 609 has the same configuration, which includes a comparator 62 and a data processing circuit 63 including a counter, a memory, and the like.

In the A/D conversion circuit 609 corresponding to each column of the pixel array portion 602, the comparator 62 performs a process (hereinafter referred to as a "comparison process") of comparing a potential of the input analog signal Vin and the potential of the ramp wave Vramp in each horizontal period. Moreover, in each A/D conversion circuit 609, the counter in the data processing circuit 63 counts the time (counts the number of clock cycles) from a time of an initial value of the ramp wave Vramp to a time of a completion of a comparison process of the comparator 62. Further, each A/D conversion circuit 609 outputs a digital signal indicating the time counted by the counter in the data processing circuit 63 as a digital signal Dout generated according to the magnitude of the analog signal Vin input to the A/D conversion circuit 609.

The horizontal scanning circuit 606 selects the digital signal Dout converted by each A/D conversion circuit 609 provided in the column A/D conversion circuit 605 in respective columns of the pixel array portion 602 according to the control signal input from the control circuit 607 and sequentially outputs the digital signal Dout of the selected column as the output of the solid-state imaging device 600.

In this manner, the conventional solid-state imaging device 600 outputs the digital signal Dout obtained by the column A/D conversion circuit 605 converting the analog signal Vin obtained after removing noise from the pixel signal generated by each pixel 61 of the pixel array portion 602.

Here, the operation of the A/D conversion circuit 609 provided in the conventional solid-state imaging device 600 will be described. FIG. 10 is a timing chart showing the operation of the A/D conversion circuit 609 provided in the conventional solid-state imaging device 600. FIG. 10 shows waveforms of the analog signal Vin and the ramp wave Vramp input to the comparator 62 provided in the A/D conversion circuit 609 in one horizontal period of the solid-state imaging device 600 and a comparator output signal CMPOUT output as a result of the comparison process of the comparator 62.

In an analog/digital conversion operation of the A/D conversion circuit 609, the comparator 62 provided in the A/D conversion circuit 609 compares the potential of the input analog signal Vin and the potential of the ramp wave Vramp in a reset period and a signal read period. More specifically, the comparator 62 compares the analog signal Vin with a reset level in the reset period and compares the analog signal Vin with a signal level in the signal read period. As shown in FIG. 10, the comparator 62 outputs the comparator output signal CMPOUT when the potential of the ramp wave Vramp is equal to or lower than the potential of the analog signal Vin in the respective periods.

In this case, the data processing circuit 63 provided in the A/D conversion circuit 609 counts the time (counts the number of clock cycles) from the time of the initial value ramp wave Vramp to a time at which the comparator output signal CMPOUT is output from the comparator 62 in each of the reset period and the signal read period. More specifically, the counter in the data processing circuit 63 counts the time (counts the number of clock cycles) of a period tr shown in FIG. 10, from the time of the initial value of the ramp wave Vramp to the time at which the comparison process of the comparator 62 is completed in the reset period. In this way, as shown in FIG. 10, a digital signal (that is, digital value Dr) corresponding to the magnitude (that is, the value of a reset signal of the pixel 61) of the reset level of the analog signal Vin is obtained. Moreover, the counter in the data processing circuit 63 counts the time (counts the number of clock cycles) of a period ts shown in FIG. 10, from the time of the initial value of the ramp wave Vramp to the time at which the comparison process of the comparator 62 is completed in the signal read period. In this way, as shown in FIG. 10, a digital signal (that is, digital value Dr+digital value Ds) corresponding to the magnitude (that is, the sum of the values of the reset signal and the pixel signal of the pixel 61) in which the reset level and the signal level of the analog signal Vin are combined is obtained.

The data processing circuit 63 outputs a digital signal Dout corresponding to the magnitude of the analog signal Vin input to the A/D conversion circuit 609 based on the digital signal indicating the time (the number of clock cycles) counted by the counter in the reset period and the signal read period. More specifically, the data processing circuit 63 performs a digital correlated double sampling (CDS) process of subtracting the digital signal (that is, digital value Dr) obtained in the reset period from the digital signal (that is, digital value Dr+digital value Ds) obtained in the signal read period and outputs a digital signal Dout having the value (that is, digital value Ds) of a pixel signal corresponding to the amount of light incident on the pixel 61.

In this manner, in the conventional solid-state imaging device 600, the counter in the data processing circuit 63 provided in each A/D conversion circuit 609 disposed in each column counts the time (counts the number of clock cycles) elapsed from the time of the initial value of the ramp wave Vramp to the time at which the comparison process of the comparator 62 is completed in each horizontal period, whereby the digital signal Dout having the value (that is, digital value Ds) of the pixel signal corresponding to the amount of light incident on the pixel 61 is output.

SUMMARY OF THE INVENTION

According to a first aspect of the present invention, an analog/digital converter includes: a ramp signal generation circuit configured to generate a ramp signal of which potential monotonously changes with time at a certain rate; a comparison circuit configured to compare potential of an input analog signal with potential of the ramp signal, and to output a comparator output signal indicating that a predetermined condition is satisfied if the potential of the ramp signal satisfies the predetermined condition in relation to the potential of the analog signal; a count control circuit configured to divide a predetermined ramp period in which the ramp signal generation circuit outputs the ramp signal into a predetermined number n of divided ramp periods (where n is an integer of 2 or more), and to output a count-stop signal for stopping counting of time in each of the divided ramp periods; a counter circuit configured to count time in the divided ramp period from a time when the comparator output signal is input to a time when the count-stop signal is first input, and to output a count value of the counted time; and a decoder circuit configured to generate a digital signal corresponding to the input analog signal according to a digital value corresponding to the count value and a digital value corresponding to any one of the divided ramp periods in which the counter circuit has started counting of time, and to output the generated digital signal.

According to a second aspect of the present invention, in the analog/digital converter according to the first aspect, the digital value corresponding to the count value may be a digital value obtained by decoding the count value, and the digital value corresponding to any one of the divided ramp periods in which the counter circuit has started counting of time may be an offset value corresponding to a digital value obtained by decoding a count value of a time counted from a time when the counter circuit has started counting of time to a time when the ramp period ends.

According to a third aspect of the present invention, in the analog/digital converter according to the second aspect, the offset value may be a digital value calculated based on the number of divisions n, information indicating a divided ramp period in which the counter circuit has started counting of the time, and a digital value obtained by decoding the count value obtained by counting of time in all periods of the ramp period.

According to a fourth aspect of the present invention, in the analog/digital converter according to the third aspect, the number of divisions n may be a power of 2, and the information indicating the divided ramp period in which the counter circuit has started counting of time may be a digital value of the number of bits that is a base 2 logarithm of the number of divisions n.

According to a fifth aspect of the present invention, in the analog/digital converter according to the fourth aspect, the number of divisions n may be 2, and the information indicating the divided ramp period in which the counter circuit has started counting of time may be a digital value of one bit.

According to a sixth aspect of the present invention, solid-state imaging device includes: a pixel array portion in which a plurality of pixels outputting a pixel signal corresponding to an amount of light incident thereon are disposed in a 2-dimensional matrix form; and a plurality of the analog/digital converters according to any one of claims 1 to 5 in which each analog/digital converter is disposed in each column or a plurality of columns of the pixel array portion so as to A/D-convert the pixel signals output in a reset period and a signal read period of the pixel. The comparison circuit and the counter circuit of the analog/digital converter are disposed in each column or a plurality of columns of the pixel array portion, the ramp signal generation circuit of the analog/digital converter is disposed that is common to all comparison circuits, the count control circuit of the analog/digital converter is disposed that is common to all counter circuit, each of the plurality of comparison circuits receives the analog signal corresponding to the pixel signal output from the pixel in the corresponding column in each row of the pixel array portion and outputs the comparator output signal obtained by comparing the potential of the input analog signal and the potential of the ramp signal, each of the plurality of counter circuits outputs the count values of the time counted in the divided ramp period from the time at which the comparator output signal is input from the corresponding comparison circuit to the time at which the count-stop signal is first input in each row of the pixel array portion, and the decoder circuit generates, for each column of the pixel array portion, a digital signal corresponding to the analog signal according to a digital value corresponding to the count value output by the counter circuit and a digital value corresponding to any one of the divided ramp periods in which the counter circuit has output the count value started counting of time, and sequentially outputs the generated digital signal in each column of the pixel array portion.

According to a seventh aspect of the present invention, in the solid-state imaging device according to the sixth aspect, the decoder circuit of the analog/digital converter may be disposed that is common to all counter circuits.

BRIEF DESCRIPTION OF THE DRAWINGS

FIG. 3 is a table showing offset values corresponding to stop signal values in the A/D conversion circuit provided in the solid-state imaging device according to the first embodiment.

FIG. 7 is a table showing offset values corresponding to stop signal values in the A/D conversion circuit provided in the solid-state imaging device according to the second embodiment.

DETAILED DESCRIPTION OF THE INVENTION

First Embodiment

Figure 1:
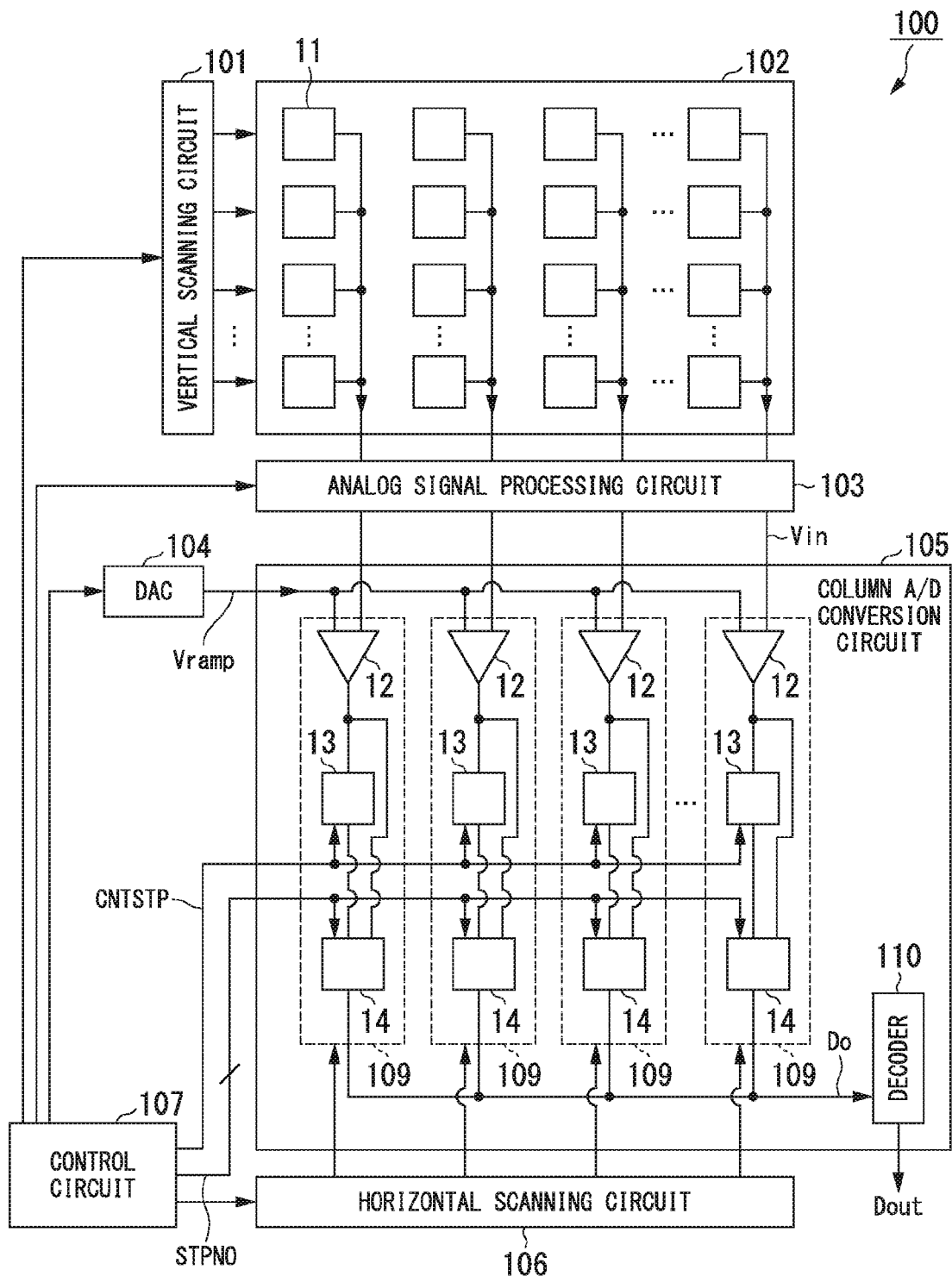
FIG. 1 is a block diagram showing the overall configuration of a solid-state imaging device according to a first embodiment of the present invention.

Hereinafter, a first embodiment of the present invention will be described with reference to the drawings. FIG. 1 is a block diagram showing the overall configuration of a solid-state imaging device according to the first embodiment. A solid-state imaging device 100 shown in FIG. 1 includes a vertical scanning circuit 101, a pixel array portion 102, an analog signal processing circuit 103, a ramp signal generation circuit (hereinafter referred to as "DAC") 104, a column analog/digital (A/D) conversion circuit 105, a horizontal scanning circuit 106, and a control circuit 107.

The solid-state imaging device 100 removes noise from pixel signals output from respective pixels 11 in the pixel array portion 102 with the aid of the analog signal processing circuit 103, converts analog signals Vin obtained after the noise removal to digital signals Dout with the aid of A/D conversion circuits (analog/digital converters) 109 provided in the column A/D conversion circuit 105, and sequentially outputs the digital signals Dout.

The vertical scanning circuit 101 selects pixels 11 in the pixel array portion 102 in respective rows of the pixel array portion 102 according to a control signal input from the control circuit 107 and outputs pixel signals generated by the respective pixels 11 of the selected row to the analog signal processing circuit 103. In the following description, a period of time from a certain row of the pixel array portion 102 being selected to a next row being selected is referred to as a "horizontal period".

The pixel array portion 102 is a pixel array in which a plurality of pixels 11 are disposed 2-dimensionally in row and column directions. Each of the pixels 11 includes a photodiode, and the photodiode provided in the pixel 11 generates a pixel signal corresponding to the amount of light which is incident to the photodiode in a certain storage period. The pixel array portion 102 outputs a pixel signal generated by the selected pixel 11 to the analog signal processing circuit 103 according to the selection from the vertical scanning circuit 101.

The analog signal processing circuit 103 removes reset noise and 1/f noise from the pixel signal input from the pixel array portion 102 according to the control signal input from the control circuit 107 and amplifies the pixel signal obtained after the noise removal. The analog signal processing circuit 103 outputs the amplified pixel signal to the column A/D conversion circuit 105 as the analog signal Vin.

The DAC 104 generates a ramp wave Vramp which is an analog signal of which the potential decreases with time at a certain rate in each horizontal period according to the control signal input from the control circuit 107. Moreover, the DAC 104 outputs the generated ramp wave Vramp to the column A/D conversion circuit 105 in a predetermined period (hereinafter referred to as a "ramp period") in which the ramp wave Vramp is output.

The control circuit 107 outputs a control signal configured to control the driving of the vertical scanning circuit 101, the analog signal processing circuit 103, the DAC 104, the column A/D conversion circuit 105, and the horizontal scanning circuit 106. A method in which the control circuit 107 controls the driving of the vertical scanning circuit 101, the analog signal processing circuit 103, the DAC 104, and the horizontal scanning circuit 106 is the same as a conventional control method, and a detailed description thereof will be omitted.

Moreover, the control circuit 107 divides a predetermined ramp period into a predetermined number of n (where n is an integer of 2 or more) periods (hereinafter, the divided respective periods will be referred to as "divided ramp periods"). At the ending time of each divided ramp period, the control circuit 107 outputs a count-stop signal CNTSTP configured to stop the counting of time, which is performed when the A/D conversion circuit 109 performs analog/digital conversion, to the counter 13 in each A/D conversion circuit 109 provided in the column A/D conversion circuit 105.

Moreover, the control circuit 107 outputs N (where $N=\log_2 n$) bits of information, which is configured to identify respective divided ramp periods to a memory 14 in each A/D conversion circuit 109 provided in the column A/D conversion circuit 105, as a stop position signal STPNO for identifying a divided ramp period in which the A/D conversion circuit 109 stops counting of time according to the count-stop signal CNTSTP. In this manner, in the control circuit 107, the number of divisions n, and the number of bits N of the stop position signal STPNO satisfy a relation of $n=2^N$. A detailed description of the count-stop signal CNTSTP and the stop position signal STPNO output by the control circuit 107 will be provided below.

The column A/D conversion circuit 105 includes a number of A/D conversion circuits 109 having the same configuration, corresponding to the number of columns of the pixel array portion 102. The A/D conversion circuit 109 includes a comparator 12, a counter 13, and the memory 14. Moreover, the column A/D conversion circuit 105 includes a decoder 110, which is common for a plurality of A/D conversion circuits 109. The A/D conversion circuit 109 corresponding to each column of the pixel array portion 102 converts the analog signal Vin input in each horizontal period according to a control signal input from the control circuit 107 and outputs a digital value Do corresponding to the magnitude of the analog signal Vin.

The comparator 12 performs a process (herein after referred to as a "comparison process") of comparing the potential of the analog signal Vin input from the analog signal processing circuit 103 and the potential of the ramp wave Vramp input from the DAC 104. In the comparison process of the comparator 12, when the potential of the ramp wave Vramp is equal to or lower than the potential of the analog signal Vin, a comparator output signal CMPOUT indicating that state is output to the counter 13 and the memory 14 as a result of the comparison process.

The counter 13 counts time from a time at which the comparator output signal CMPOUT is input from the comparator 12 (that is a time at which the comparison process of the comparator 12 is completed) to a time at which the count-stop signal CNTSTP is input from the control circuit 107 in the ramp period. In this way, the counter 13 counts the time within any one of the divided ramp periods of the ramp period. The counting of time within the divided ramp period is performed by counting the number of reference clock signals (that is, the number of clock cycles). The counter 13 outputs a digital value indicating the counted count value (where the count value=the number of clock cycles) of the divided ramp period to the memory 14.

The memory 14 stores a digital value indicating the count value (the number of clock cycles) of the divided ramp period input from the counter 13. Moreover, the memory 14 stores N bits of information of the stop position signal STPNO input from the control circuit 107 at the time at which the comparator output signal CMPOUT is input from the comparator 62 in the ramp period. In this way, the memory 14 stores the information of the divided ramp period in which the counter 13 counted the time within the ramp period. The memory 14 outputs the stored digital value from the counter 13 and the N bits of information of the stop position signal STPNO as a digital value Do generated according to the magnitude of the analog signal Vin input from the analog signal processing circuit 103.

The horizontal scanning circuit 106 selects the digital value Do converted by each A/D conversion circuit 109 provided in the column A/D conversion circuit 105 in respective columns of the pixel array portion 102 according to the control signal input from the control circuit 107 and sequentially outputs the digital value Do of the selected columns to the decoder 110.

The decoder 110 generates a digital signal corresponding to the magnitude of the analog signal Vin of each column of the pixel array portion 102, output by the analog signal processing circuit 103 based on the digital value Do including the digital value from the counter 13 sequentially input from each A/D conversion circuit 109 and the information on the stop position signal STPNO, and sequentially outputs the generated digital signal as the digital signal Dout corresponding to the amount of light incident on the solid-state imaging device 100. A detailed description of a method in which the decoder 110 generates the digital signal Dout will be provided below.

First Specific Example

Here, an operation of the A/D conversion circuit 109 provided in the solid-state imaging device 100 will be described. The analog/digital conversion operation of the A/D conversion circuit 109 is similar to an operation of a conventional A/D conversion circuit 609. That is, an operation of converting the input analog signal Vin to a digital signal in a reset period and a signal read period is performed. In this case, the control circuit 107 divides the ramp period into a plurality of n divided ramp periods as described above. In the first specific example, the analog/digital conversion operation of the A/D conversion circuit 109 when the ramp period is evenly divided into two periods (that is, the number of divisions n=2) will be described. In the first specific example, a case in which only the signal read period is evenly divided into two periods will be described in order to facilitate the description.

Figure 2:
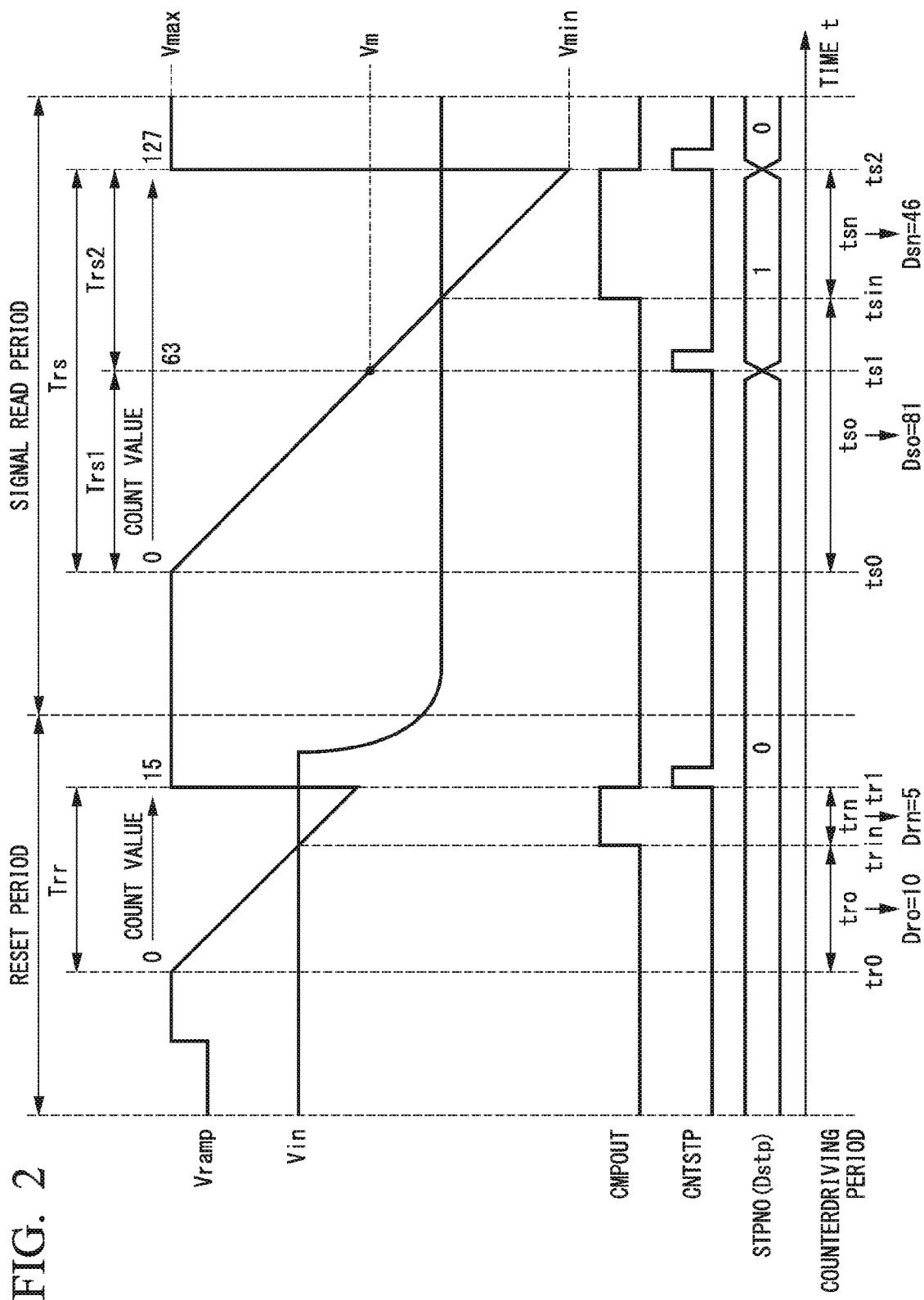
FIG. 2 is a timing chart showing a first specific example of the operation of an analog/digital (A/D) conversion circuit provided in the solid-state imaging device according to the first embodiment.

FIG. 2 is a timing chart showing the first specific example of the operation of the A/D conversion circuit 109 provided in the solid-state imaging device 100 according to the first embodiment. The timing chart of the first specific example shown in FIG. 2 is an example of a timing chart in which the potential of the analog signal Vin in the signal read period is lower than an intermediate potential Vm (Vm=(Vmax+Vmin)/2 and Vin<VM) which is an intermediate potential between the maximum potential Vmax and the minimum potential Vmin of the analog signal Vin.

Figure 9:
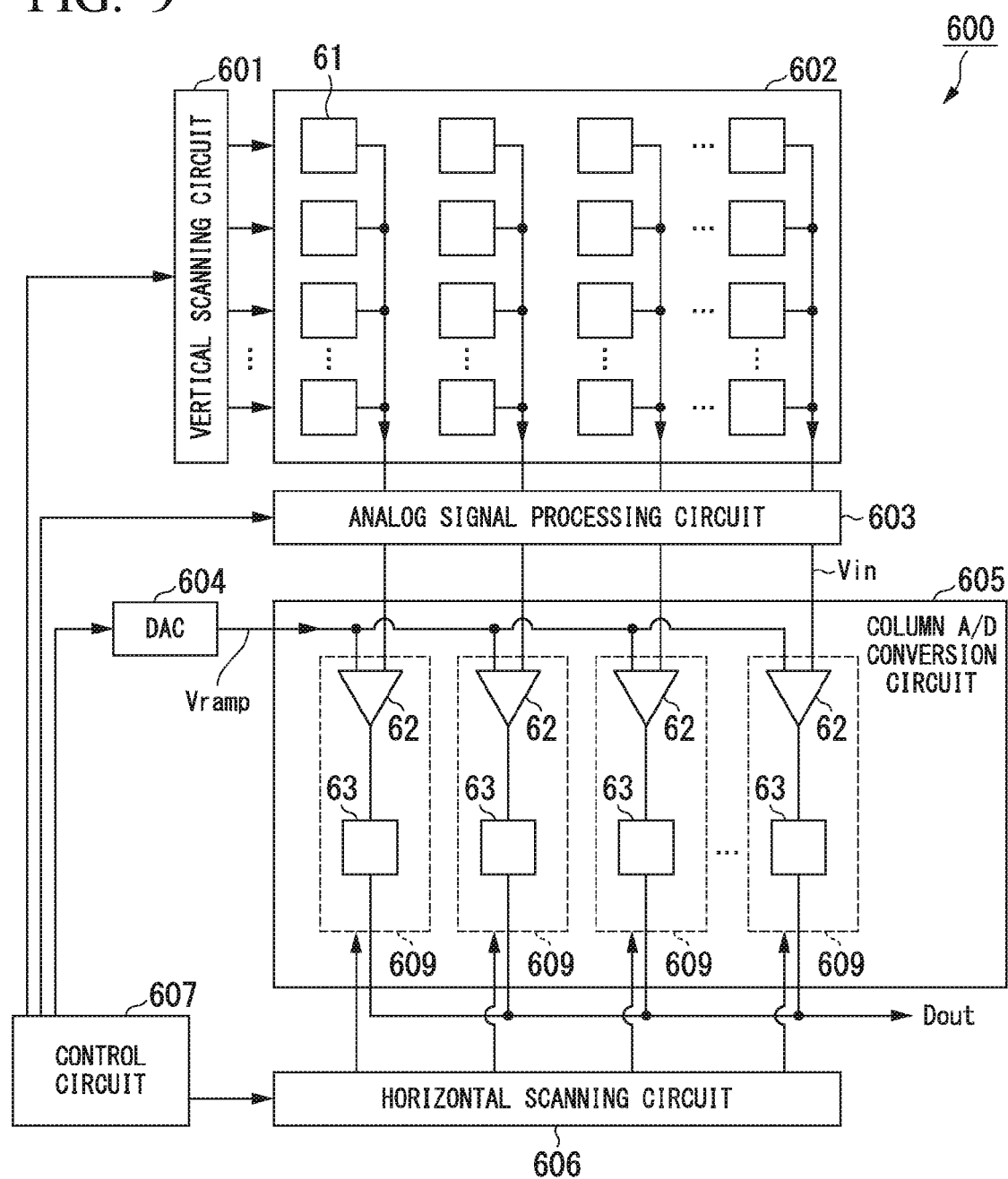
FIG. 9 is a block diagram showing the overall configuration of a conventional solid-state imaging device.
Figure 10:
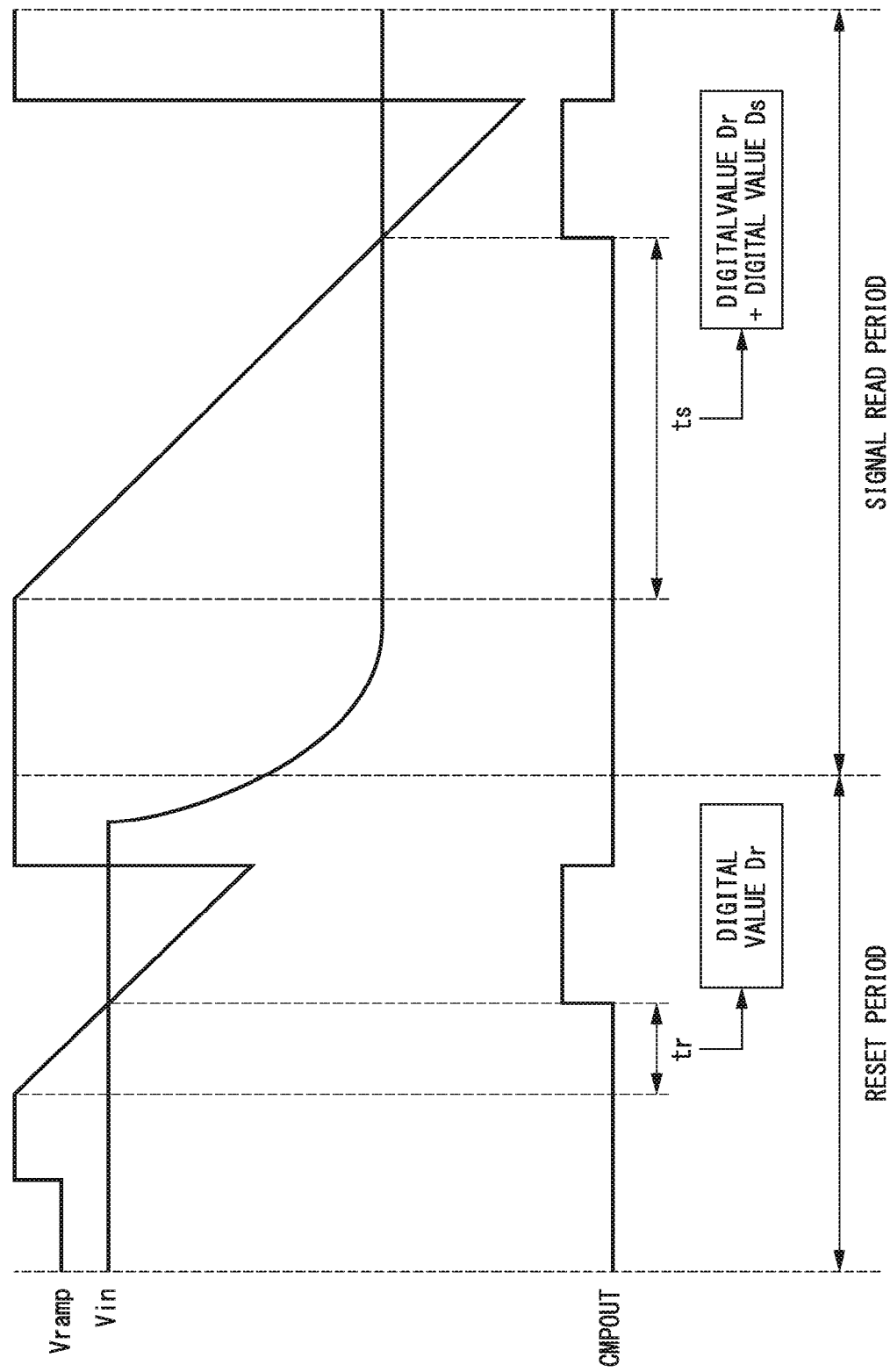
FIG. 10 is a timing chart showing an operation of an A/D conversion circuit provided in the conventional solid-state imaging device.

FIG. 2 shows waveforms of the analog signal Vin and the ramp wave Vramp input to the comparator 12 provided in the A/D conversion circuit 109 in one horizontal period of the solid-state imaging device 100, the comparator output signal CMPOUT output as the result of the comparison process of the comparator 12, and the count-stop signal CNTSTP and the stop position signal STPNO output by the control circuit 107 in order to control the driving of the A/D conversion circuit 109. Moreover, FIG. 2 shows the driving period of the counter 13 provided in the A/D conversion circuit 109 and the driving period of the counter provided in the A/D conversion circuit 609 in the conventional solid-state imaging device 600 shown in FIG. 9.

In the first specific example, as shown in FIG. 2, the number of clock cycles in a ramp period Trr between time points tr0 and tr1 within the reset period is 15 (that is, the count value when all periods of the ramp period Trr are counted is 15). Thus, the maximum value of the digital value in the ramp period Trr is 15. Moreover, in the first specific example, as shown in FIG. 2, the number of clock cycles in a ramp period Trs between time points ts0 and ts2 in the signal read period is 127 (that is, the count value when all periods of the ramp period Trs are counted is 127). Thus, the maximum value of the digital value in the ramp period Trs is 127.

The control circuit 107 evenly divides the ramp period Trs in the signal read period into two periods of a divided ramp period Trs1 between the time point ts0 and a time point ts1 and a divided ramp period Trs2 between the time points ts1 and ts2. Moreover, as shown in FIG. 2, the control circuit 107 outputs a count-stop signal CNTSTP having a "High" level to the counter 13 in each A/D conversion circuit 109 provided in the column A/D conversion circuit 105 at the time at which each divided ramp period ends (that is, the time at which each of the divided ramp period Trs1 and the divided ramp period Trs2 ends).

Moreover, the control circuit 107 outputs a stop position signal STPNO configured to identify the respective divided ramp periods (that is, whether the present period is the divided ramp period Trs1 or the divided ramp period Trs2) to the memory 14 in each A/D conversion circuit 109 provided in the column A/D conversion circuit 105. In the first specific example, since the ramp period Trs is evenly divided into two periods (that is, the number of divisions n=2), the stop position signal STPNO is N bits of information (that is, $N=\log_2 n=\log_2 2=1$) as shown in FIG. 2.

In the analog/digital conversion operation of the A/D conversion circuit 109, first, the comparator 12 performs a process (comparison process) of comparing the potential of the analog signal Vin with a reset level input from the analog signal processing circuit 103 and the potential of the ramp wave Vramp input from the DAC 104 from the time point tr0 which is the starting time of the ramp period Trr in the reset period. The comparator 12 outputs the comparator output signal CMPOUT having a "High" level to the counter 13 and the memory 14 from a time point trin at which the potential of the ramp wave Vramp becomes equal to or lower than the potential of the analog signal Vin with a reset level.

The counter 13 starts counting time from the time point trin at which the comparator output signal CMPOUT is input in the ramp period Trr and stops counting of time at the time point tr1 at which the count-stop signal CNTSTP is input from the control circuit 107. In this manner, the counter 13 obtains a digital value obtained by counting the number of reference clock signals (the number of clock cycles) in a period trn shown in FIG. 2 (that is, a digital value corresponding to the magnitude (the value of the reset signal of the pixel 11) of the analog signal Vin with a reset level input from the analog signal processing circuit 103). FIG. 2 shows a case in which a digital value Drn=5 is obtained as the digital value Drn indicating the magnitude of the analog signal Vin with a reset level.

In the operation of the conventional A/D conversion circuit 609, the counter 13 counts the time from the time of the initial value of the ramp wave Vramp to the timing at which the comparator output signal CMPOUT is input. That is, in the operation of the conventional A/D conversion circuit 609, the number of the reference clock signal (the number of clock cycles) in a period tro between the time points tr0 and trin shown in FIG. 2 is counted, and a digital value Dro=10 is obtained as a digital value Dro indicating the magnitude of the analog signal Vin with a reset level.

Subsequently, in the analog/digital conversion operation of the A/D conversion circuit 109, in the signal read period, the comparator 12 performs a process (comparison process) of comparing the potential of the analog signal Vin with a reset+signal level input from the analog signal processing circuit 103 and the potential of the ramp wave Vramp input from the DAC 104 from the time point ts0 which is the starting time of the ramp period Trs. Moreover, the comparator 12 outputs a comparator output signal CMPOUT having the "High" level to the counter 13 and the memory 14 at the time point tsin at which the potential of the ramp wave Vramp becomes equal to or lower than the potential of the analog signal Vin with a reset+signal level.

The counter 13 starts counting of time from the time point tsin at which the comparator output signal CMPOUT is input in the ramp period Trs (that is, the counter 13 starts counting of time after the divided ramp period Trs2 starts). After that, the counter 13 stops counting of time at the time point ts2 at which the count-stop signal CNTSTP is first input from the control circuit 107 after the counting of time starts. In this manner, the counter 13 obtains a digital value obtained by counting of time (counting the number of clock cycles) of the period tsn in the divided ramp period Trs2 shown in FIG. 2 (that is, a digital value corresponding to the magnitude (the sum of the value of the reset signal of the pixel 11 and the value of the pixel signal) of the analog signal Vin with the reset+signal level input from the analog signal processing circuit 103). FIG. 2 shows a case in which a digital value Dsn=46 is obtained as a digital value Dsn indicating the magnitude of the analog signal Vin with the reset+signal level.

In the operation of the conventional A/D conversion circuit 609, since the counter 13 counts the number of reference clock signals (the number of clock cycles) in a period tso between the time points ts0 and tsin shown in FIG. 2 in order to clock the time from the time of the initial value of the ramp wave Vramp to the time at which the comparator output signal CMPOUT is input. In this way, in the operation of the conventional A/D conversion circuit 609, as shown in FIG. 2, a digital value Dso=81 is obtained as a digital value Dso indicating the magnitude of the analog signal Vin with the reset+signal level.

After that, the counter 13 performs a digital CDS process based on the digital value Drn and the digital value Dsn obtained in the reset period and the signal read period, respectively, to calculate a digital value Dcnt corresponding to the magnitude of the analog signal Vin input to the A/D conversion circuit 109. More specifically, the counter 13 calculates the digital value Dcnt by the digital CDS process of subtracting the digital value Dsn obtained in the signal read period from the digital value Drn obtained in the reset period. Moreover, the counter 13 outputs the calculated digital value Dcnt to the memory 14. In the example shown in FIG. 2, since the digital value Drn=5 and the digital value Dsn=46, the counter 13 calculates a digital value Dcnt as shown in Equation (1) below and outputs the digital value Dcnt to the memory 14.

$$Dcnt = Drn - Dsn = 5 - 46 = -41 \tag{1}$$

In this manner, the memory 14 stores the digital value Dcnt input from the counter 13. Moreover, the memory 14 stores one bit of information of the stop position signal STPNO input from the control circuit 107 as a stop signal value Dstp at the time point tsin at which the comparator output signal CMPOUT is input. In the example shown in FIG. 2, a stop signal value Dstp=1 is stored.

Moreover, the memory 14 outputs the stored digital value Dcnt and stop signal value Dstp to the decoder 110 as a digital value Do generated by the A/D conversion circuit 109, corresponding to the magnitude of the analog signal Vin input from the analog signal processing circuit 103.

The decoder 110 determines an offset value Doff for correcting the digital value Dcnt based on the stop signal value Dstp included in the digital value Do input from the A/D conversion circuit 109. The offset value Doff is a value calculated by Equation (2) below.

$$Doff=(Dsmax+1)\times(Dstp+1)/n-(Drmax+1) \qquad (2)$$

In Equation (2). Dsmax is the maximum value of a digital value in the ramp period Trs, and Drmax is the maximum value of a digital value in the ramp period Trr, which are predetermined values in the A/D conversion circuit 109. In the example shown in FIG. 2, the digital value Dsmax is the maximum value (that is, 127) of the count value when all periods of the ramp period Trs are counted, and the digital value Drmax is the maximum value (that is, 15) of the count value when all periods of the ramp period Trr are counted. Moreover, n in Equation (2) is the number of divisions, and the number of divisions n=2 in the example shown in FIG. 2. Moreover, in the example shown in FIG. 2, the stop signal value Dstp=1. Thus, the decoder 110 calculates an offset value Doff as shown in Equation (3) below from Equation (2).

$$Doff=(127+1)\times(1+1)/2-(15+1)=128\times1-16=112 \qquad (3)$$

The offset value Doff may be calculated in advance for each stop signal value Dstp. In this case, the offset value Doff calculated in advance may be set or stored in the decoder 110. For example, in the example shown in FIG. 2, offset values Doff such as are shown in FIG. 3 corresponding to the respective stop signal values Dstp may be calculated in advance, and the calculated respective offset values Doff may be set or stored as a table of the decoder 110.

Moreover, the decoder 110 adds the determined offset value Doff to the digital value Dcnt included in the digital value Do input from the A/D conversion circuit 109 and outputs a sum as a digital signal Dout converted by the A/D conversion circuit 109, corresponding to the amount of light incident on the pixel 11. In the example shown in FIG. 2, a digital signal Dout such as is shown in Equation (4) below is output as the digital signal Dout.

$$Dout=Dcnt+Doff=-41+112=71 \qquad (4)$$

In the operation of the conventional A/D conversion circuit 609, a data processing circuit 63 performs a digital CDS process of subtracting a digital value Dro indicating the magnitude of the analog signal Vin with the reset level from a digital value Dso indicating the magnitude of the analog signal Vin with the reset+signal level and outputs a difference as a digital signal Dout. In the example shown in FIG. 2, since the digital value Dso=81 and the digital value Dro=10, the conventional A/D conversion circuit 609 outputs a digital signal Dout such as is shown in Equation (5) below.

$$Dout=Dso-Dro=81-10=71 \qquad (5)$$

In this manner, the A/D conversion circuit 109 outputs the same digital signal Dout as the output result of the conventional A/D conversion circuit 609 by the operation indicated in the first specific example.

Here, the number of bits of the counter 13 provided in the A/D conversion circuit 109 will be described. In the first specific example shown in FIG. 2, since the count value when all periods of the ramp period Trs are counted is 127, a usual number of bits required for the counter is 7 bits. The usual number of bits (7 bits) is the number of bits required for the counter provided in the data processing circuit 63 in the A/D conversion circuit 609 of the conventional solid-state imaging device 600.

However, the counter 13 provided in the A/D conversion circuit 109 in the solid-state imaging device 100 counts the time in any one of the divided ramp periods within the ramp period Trs divided by the control circuit 107 as described above. More specifically, as shown in FIG. 2, the counter 13 counts the time in one divided ramp period Trs2 among the two divided ramp periods obtained by the control circuit 107 evenly dividing the ramp period Trs. Thus, the maximum count value of the divided ramp period counted by the counter 13 is 63 and the number of bits required for the counter 13 is 6 bits.

In this way, the solid-state imaging device 100 can reduce the number of bits of the counter 13 provided in the A/D conversion circuit 109 by the number of bits corresponding to the number of divisions n through the control circuit 107 dividing the ramp period Trs. More specifically, the number of bits of the counter 13 can be reduced by the number of bits of a base 2 logarithm of the number of divisions n ($\log_2$ n) (that is, the same number of bits as the number of bits N (where N=$\log_2$ n) of the stop position signal STPNO output by the control circuit 107). In this way, the solid-state imaging device 100 can reduce the number of bits of the counter 13 in each A/D conversion circuit 109 provided in the column A/D conversion circuit 105.

In the column A/D conversion circuit 105 in the solid-state imaging device 100, the decoder 110 common to each A/D conversion circuit 109 determines an offset value Doff based on the stop position signal STPNO (that is, the stop signal value Dstp stored in the memory 14) output by the control circuit 107 and adds the offset value Doff to the digital value Dcnt output by the counter 13 of which the number of bits is reduced to, thereby correct the value of the output digital signal. In this way, the solid-state imaging device 100 having the column A/D conversion circuit 105 can output the same digital value as the result of the conventional solid-state imaging device 600 as a final digital signal Dout.

Second Specific Example

Figure 4:
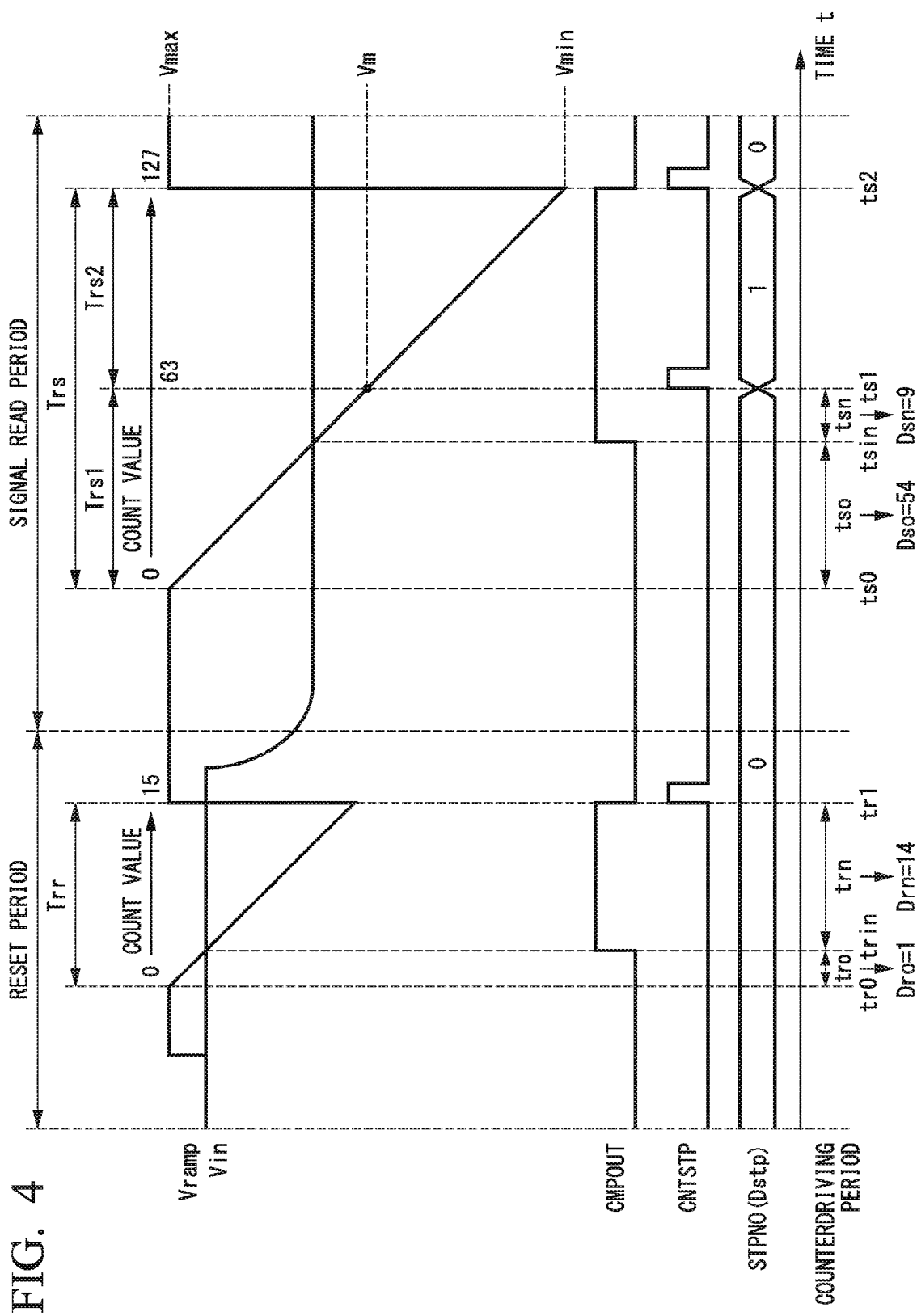
FIG. 4 is a timing chart showing a second specific example of the operation of the A/D conversion circuit provided in the solid-state imaging device according to the first embodiment.

Next, another operation of the A/D conversion circuit 109 provided in the solid-state imaging device 100 will be described. FIG. 4 is a timing chart showing the second specific example of the operation of the A/D conversion circuit 109 provided in the solid-state imaging device 100 according to the first embodiment. The timing chart of the second specific example shown in FIG. 4 is an example of a timing chart in which the potential of the analog signal Vin in the signal read period is higher than the intermediate potential Vm of the analog signal Vin (Vin>Vm).

FIG. 4 shows waveforms of the analog signal Vin and the ramp wave Vramp in one horizontal period of the solid-state imaging device 100, the comparator output signal CMPOUT, and the count-stop signal CNTSTP and the stop position signal STPNO, similar to the timing chart of the first specific example shown in FIG. 2. Moreover, FIG. 4 shows the driving period of the counter 13 provided in the A/D conversion circuit 109 and the driving period of the counter provided in the A/D conversion circuit 609 in the conventional solid-state imaging device 600) shown in FIG. 9, similar to the timing chart of the first specific example shown in FIG. 2.

The timing chart of the second specific example shown in FIG. 4 in which the potential of the analog signal Vin in the signal read period is higher than the intermediate potential Vm of the analog signal Vin (Vin>Vm) is different from the timing chart of the first specific example shown in FIG. 2 in which the potential of the analog signal Vin is lower than the intermediate potential Vm of the analog signal Vin (Vin>Vm). Thus, in the following description, the operation different from the timing chart of the first specific example shown in FIG. 2 will be described, and a detailed description of the operation same as the timing chart of the first specific example shown in FIG. 2 will be omitted.

First, in the analog/digital conversion operation of the second specific example by the A/D conversion circuit 109 shown in FIG. 4, in the reset period, the comparator 12 performs a process (comparison process) of comparing the potential of the analog signal Vin with the reset level input from the analog signal processing circuit 103 and the potential of the ramp wave Vramp input from the DAC 104 from the time point tr0 at which the ramp period Trr starts, similar to the first specific example shown in FIG. 2. The comparator 12 outputs a comparator output signal CMPOUT having a "High" level to the counter 13 and the memory 14 at the time point trin at which the potential of the ramp wave Vramp becomes equal to or lower than the potential of the analog signal Vin with a reset level.

The counter 13 starts counting time from the time point trin at which the comparator output signal CMPOUT is input in the ramp period Trr and stops counting of time at the time point tr1 at which the count-stop signal CNTSTP is input from the control circuit 107, similar to the first specific example shown in FIG. 2. In this manner, the counter 13 counts the number of reference clock signals (the number of clock cycles) in a period trn shown in FIG. 4 to obtain a digital value corresponding to the magnitude (that is, the value of the reset signal of the pixel 11) of the analog signal Vin with a reset level input from the analog signal processing circuit 103. FIG. 4 shows a case in which a digital value Drn=14 is obtained as a digital value Drn indicating the magnitude of the analog signal Vin with the reset level.

In the operation of the conventional A/D conversion circuit 609, the number (the number of clock cycles) of the reference clock signal in a period tro between the time points tr0 and trin shown in FIG. 4 is counted, and a digital value Dro=1 is obtained as a digital value Dro indicating the magnitude of the analog signal Vin with a reset level.

Subsequently, in the analog/digital conversion operation of the second specific example of the A/D conversion circuit 109 shown in FIG. 4, in the signal read period, the comparator 12 performs a process (comparison process) of comparing the potential of the analog signal Vin with a reset+signal level input from the analog signal processing circuit 103 and the potential of the ramp wave Vramp input from the DAC 104 from the time point ts0 which is the starting time of the ramp period Trs, similar to the first specific example shown in FIG. 2. Moreover, the comparator 12 outputs a comparator output signal CMPOUT having the "High" level to the counter 13 and the memory 14 from the time point tsin at which the potential of the ramp wave Vramp becomes equal to or lower than the potential of the analog signal Vin with the reset+signal level.

The counter 13 starts counting of time from the time point tsin at which the comparator output signal CMPOUT is input in the ramp period Trs. That is, in the second specific example, the counter 13 starts counting of time in the divided ramp period Trs1. After that, the counter 13 stops counting of time at the time point ts1 at which the count-stop signal CNTSTP is input first from the control circuit 107 after the counting of time starts. In this manner, the counter 13 counts the time (counts the number of clock cycles) of the period tsn in the divided ramp period Trs1 shown in FIG. 4 to obtain a digital value corresponding to the magnitude (that is, the sum of the value of the reset signal of the pixel 11 and the value of the pixel signal) of the analog signal Vin with the reset+signal level input from the analog signal processing circuit 103. FIG. 4 shows a case in which a digital value Dsn=9 is obtained as a digital value Dsn indicating the magnitude of the analog signal Vin with the reset+signal level.

In the operation of the conventional A/D conversion circuit 609, the number of reference clock signals (the number of clock cycles) in a period tso between the time points ts0 and tsin shown in FIG. 4 is counted to obtain a digital value Dso=54 as a digital value Dso indicating the magnitude of the analog signal Vin with the reset+signal level.

After that, similar to the first specific example shown in FIG. 2, the counter 13 performs a digital CDS process based on the digital value Drn and the digital value Dsn obtained in the reset period and the signal read period, respectively, to calculate a digital value Dcnt corresponding to the magnitude of the analog signal Vin input to the A/D conversion circuit 109 and outputs the calculated digital value Dcnt to the memory 14. In the example shown in FIG. 4, since the digital value Drn=14 and the digital value Dsn=9, the counter 13 calculates a digital value Dcnt such as is shown in Equation (6) below and outputs the digital value Dcnt to the memory 14.

$$Dcnt=Drn-Dsn=14-9=5 \quad (6)$$

In this manner, the memory 14 stores the digital value Dcnt input from the counter 13, similar to the first specific example shown in FIG. 2. Moreover, the memory 14 stores one bit of information of the stop position signal STPNO input from the control circuit 107 as a stop signal value Dstp at the time point tsin at which the comparator output signal CMPOUT is input, similar to the first specific example shown in FIG. 2. In the example shown in FIG. 4, a stop signal value Dstp=0 is stored.

Moreover, similar to the first specific example shown in FIG. 2, the memory 14 outputs the stored digital value Dcnt and stop signal value Dstp to the decoder 110 as a digital value Do generated by the A/D conversion circuit 109, corresponding to the magnitude of the analog signal Vin input from the analog signal processing circuit 103.

The decoder 110 determines an offset value Doff for correcting the digital value Dcnt according to Equation (2) based on the stop signal value Dstp included in the digital value Do input from the A/D conversion circuit 109, similar to the first specific example shown in FIG. 2. In the example shown in FIG. 4, the digital value Dsmax=127, the digital value Drmax=15, and the number of divisions n=2 are all obtained. Moreover, in the example shown in FIG. 4, the stop signal value Dstp=0 is obtained. Thus, the decoder 110 calculates an offset value Doff such as is shown in Equation (7). Here, the offset value Doff calculated by the decoder 110 is the same value as the offset value Doff corresponding to the stop signal value Dstp=0 in FIG. 3.

$$Doff=(127+1)\times(0+1)/2-(15+1)=128\times1/2-16=48 \quad (7)$$

The decoder 110 adds the determined offset value Doff to the digital value Dcnt included in the digital value Do input from the A/D conversion circuit 109 and outputs a sum as a digital signal Dout converted by the A/D conversion circuit 109, corresponding to the amount of light incident on the pixel 11, similar to the first specific example shown in FIG. 2. In the example shown in FIG. 4, a digital signal Dout such as is shown in Equation (8) below is output as the digital signal Dout.

$$Dout=Dcnt+Doff=5+48=53 \qquad (8)$$

In the operation of the conventional A/D conversion circuit 609, since the digital value Dso=54 and the digital value Dro=1, a digital signal Dout such as is shown in Equation (9) below is output by the digital CDS process of the data processing circuit 63.

$$Dout=Dso-Dro=54-1=53 \qquad (9)$$

In this manner, the A/D conversion circuit 109 outputs the same digital signal Dout as the output result of the conventional A/D conversion circuit 609 by the operation indicated by the second specific example.

In this way, in the solid-state imaging device 100, the control circuit 107 divides the predetermined ramp period Trs into a plurality of n divided ramp periods and the counter 13 provided in the A/D conversion circuit 109 in the solid-state imaging device 100 counts the time in any one of the divided ramp periods in the ramp period divided by the control circuit 107. In this way, in the solid-state imaging device 100, it is possible to reduce the number of bits of the counter 13 in each A/D conversion circuit 109. Moreover, the driving period of the counter 13, when the potential of the analog signal Vin in the signal read period is lower than the intermediate potential Vm of the analog signal Vin (Vin<Vm), can be controlled to be equal to or shorter than the driving period of the counter provided in the data processing circuit 63 in the A/D conversion circuit 609 of the conventional solid-state imaging device 600. In this way, in the solid-state imaging device 100, it is possible to reduce the circuit size of the solid-state imaging device 100 itself, and to reduce the power consumption of the counter 13 provided in the A/D conversion circuit 109 in the solid-state imaging device 100. More specifically, when the potential of the analog signal Vin in the signal read period is lower than the intermediate potential Vm of the analog signal Vin (Vin<Vm) (that is, in the operation of the first specific example as shown in FIG. 2), since the driving period (that is, the period tsn) of the counter 13 is equal to or shorter than the driving period (that is, the period tso) of the counter 13 in the operation of the conventional A/D conversion circuit 609, it is possible to reduce the power consumption of the counter 13.

Figure 5:
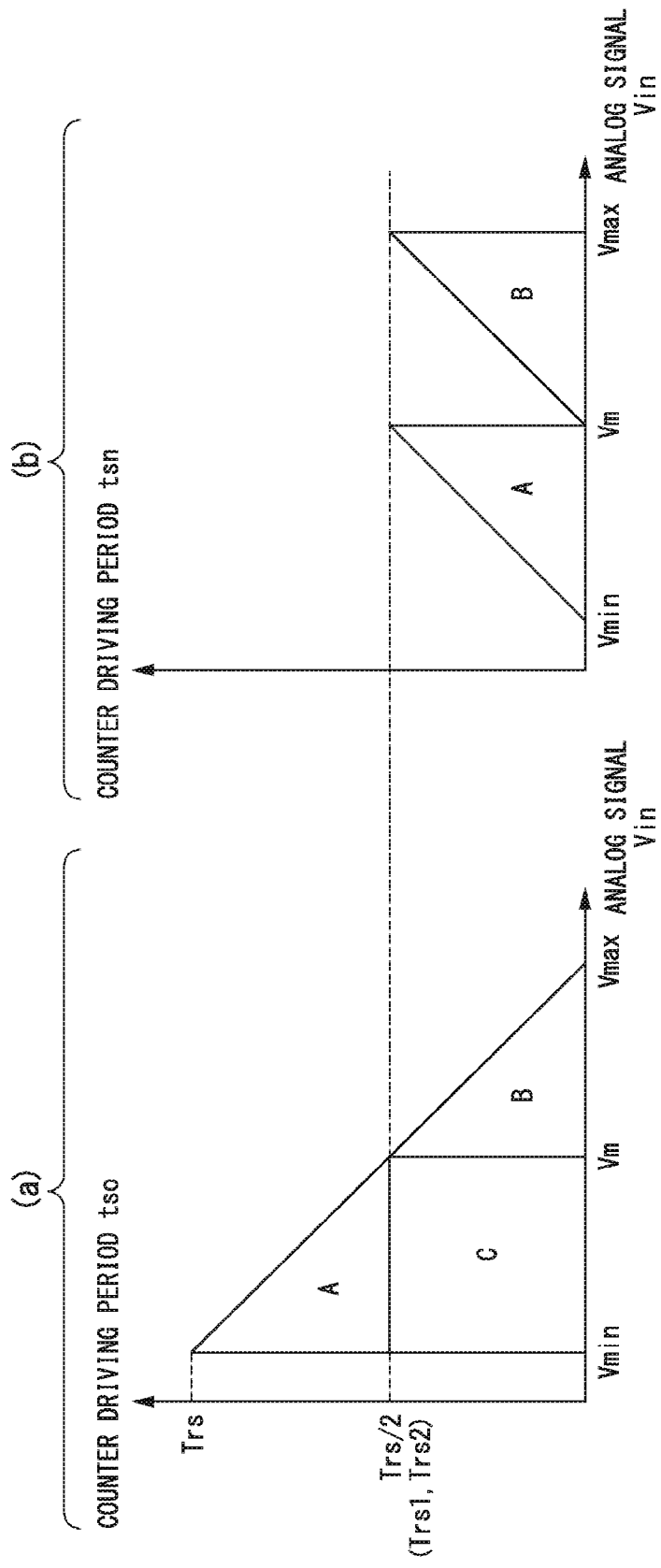
FIG. 5 is a diagram showing the relationship between a driving period of a counter and an analog signal input to the A/D conversion circuit provided in the solid-state imaging device according to the first embodiment.

Here, the power consumption of the counter 13 provided in the A/D conversion circuit 109 in the solid-state imaging device 100 will be described. FIG. 5 is a diagram showing the relationship between the driving period of the counter and the analog signal Vin input to the A/D conversion circuit 109 provided in the solid-state imaging device 100 according to the first embodiment. FIG. 5 shows the driving period of the counter when the potential of the analog signal Vin in the signal read period, input to the A/D conversion circuit 109 provided in the solid-state imaging device 100 is uniformly distributed from the minimum potential Vmin to the maximum potential Vmax in the first and second specific examples. FIG. 5(a) shows the relationship between the driving period tso of the counter and the analog signal Vin in the conventional A/D conversion circuit 609 and FIG. 5(b) shows the relationship between the driving period tsn of the counter and the analog signal Vin in the A/D conversion circuit 109.

As shown in FIG. 5(a), when an analog signal Vin uniformly distributed from the minimum potential Vmin to the maximum potential Vmax is input to the conventional A/D conversion circuit 609, the driving period of the counter provided in the data processing circuit 63 in the A/D conversion circuit 609 is uniformly distributed from all periods of the ramp period Trs to the driving period=0. More specifically, the driving period of the counter, when the potential of the analog signal Vin is the minimum potential Vmin, becomes shorter from the ramp period Trs as the potential of the analog signal Vin becomes higher, and the driving period of the counter becomes 0 when the potential of the analog signal Vin reaches the maximum potential Vmax. Thus, the power consumption of the counter in the A/D conversion circuit 609 provided in the conventional solid-state imaging device 600 corresponds to the sum of the areas of the driving periods of the indicated regions A, B, and C shown in FIG. 5(a).

However, in the solid-state imaging device 100, as shown in FIG. 5(b), the control circuit 107 evenly divides the ramp period Trs into two periods at the position where the potential of the analog signal Vin reaches the intermediate potential Vm, and the counter 13 provided in the A/D conversion circuit 109 counts the time in any one of the divided ramp periods. Thus, even when an analog signal Vin uniformly distributed from the minimum potential Vmin to the maximum potential Vmax is input to the A/D conversion circuit 109, the driving period of the counter 13 temporarily reaches the driving period=0 when the potential of the analog signal Vin reaches the intermediate potential Vm as shown in FIG. 5(b).

More specifically, the driving period of the counter 13 becomes longer as the potential of the analog signal Vin becomes higher from the driving period=0 of the counter when the potential of the analog signal Vin reaches the minimum potential Vmin, and the driving period of the counter 13 reaches the divided ramp period Trs2 when the potential of the analog signal Vin reaches the intermediate potential Vm. After that, when the potential of the analog signal Vin becomes higher than the intermediate potential Vm, the driving period of the counter 13 temporarily becomes 0. Further, the driving period of the counter 13 becomes longer again from the driving period=0 as the potential of the analog signal Vin increases. The driving period of the counter 13 becomes the divided ramp period Trs1 when the potential of the analog signal Vin reaches the maximum potential Vmax.

Thus, the power consumption of the counter 13 of the A/D conversion circuit 109 provided in the solid-state imaging device 100 corresponds to the sum of areas of the driving periods of the indicated regions A and B shown in FIG. 5(b). As can be understood from comparison between FIG. 5(a) and FIG. 5(b), in the solid-state imaging device 100, the power consumption is reduced by an amount corresponding to the area of the driving period of the indicated region C shown in FIG. 5(a). Here, the power consumption corresponding to the area of the driving period of the indicated region C corresponds to half the power consumption of the conventional solid-state imaging device 600. That is, in the solid-state imaging device 100, the power consumption of the counter 13 provided in each A/D conversion circuit 109 can be reduced by ½ (that is, 1/n) of the conventional solid-state imaging device 600.

As described above, in the solid-state imaging device 100 according to the first embodiment, the predetermined ramp period Trs is divided into two divided ramp periods, and the counter 13 provided in the A/D conversion circuit 109 counts the time in any one of the divided ramp periods. In this way, the maximum count value that the counter 13 provided in the A/D conversion circuit 109 counts in the respective divided ramp periods decreases, and the number of bits required for the counter 13 can be reduced by one bit (that is, $\log_2$ n bit). As a result, it is possible to reduce the circuit size and area of the A/D conversion circuit 109 (more specifically, the counter 13). In the solid-state imaging device 100 according to the first embodiment including a number of A/D conversion circuits 109 corresponding to the number of columns of the pixel array portion 102, it is possible to reduce the circuit size and area of the solid-state imaging device 100 itself.

Moreover, in the solid-state imaging device 100 according to the first embodiment, the driving period of the counter 13 in the A/D conversion circuit 109 becomes shorter with the operation of the counter 13 provided in the A/D conversion circuit 109 counting of time in the divided ramp period and the reduction of the number of bits of the counter 13, and the power consumption of the counter 13 can be reduced. In this way, it is possible to reduce the power consumption of the A/D conversion circuit 109 (more specifically, the counter 13), and in the solid-state imaging device 100 according to the first embodiment including a number of A/D conversion circuits 109 corresponding to the number of columns of the pixel array portion 102, it is possible to reduce the power consumption of the solid-state imaging device 100 itself.

In the solid-state imaging device 100 according to the first embodiment, the number of bits of the digital signal Dout finally output, which decreases with the reduction of the number of bits of the counter 13 provided in the A/D conversion circuit 109, is corrected when the decoder 110 common to the respective A/D conversion circuits 109 in the column A/D conversion circuit 105 in the solid-state imaging device 100 adds the offset value Doff to the digital value Dcnt output by the counter 13, of which the number of bits is reduced. Due to this, in the solid-state imaging device 100 according to the first embodiment, it is possible to output the same digital value as a final digital signal Dout as the result of the conventional solid-state imaging device 600 in which the conventional A/D conversion circuit 609 is provided in the column A/D conversion circuit 605. Thus, it is possible to reduce the circuit size and area and to reduce the power consumption without deteriorating the performance of the solid-state imaging device 100.

In the solid-state imaging device 100 according to the first embodiment the operation of a case where the number of divisions n=2, in which the control circuit 107 evenly divides the predetermined ramp period Trs into the divided ramp period Trs1 and the divided ramp periods Trs2 has been described. However, the number of divisions n in the solid-state imaging device 100 is not limited to n=2.

Second Embodiment

Next, a second embodiment of the present invention will be described. A solid-state imaging device according to the second embodiment is different from the solid-state imaging device 100 according to the first embodiment in that the number of divisions n by which the control circuit 107 divides the ramp period in the signal read period is different. A configuration of the solid-state imaging device according to the second embodiment is the same as the configuration of the solid-state imaging device 100 according to the first embodiment. Thus, it is assumed that the control circuit 107 provided in the solid-state imaging device 100 according to the first embodiment divides the ramp period into a different number of divisions n in the second embodiment, and the detailed description of the constituent elements of the solid-state imaging device according to the second embodiment will be omitted.

In the following description, an operation of the solid-state imaging device according to the second embodiment will be described using the same reference numerals as the constituent elements of the solid-state imaging device 100 according to the first embodiment shown in FIG. 1. For example, the solid-state imaging device according to the second embodiment will be described as the solid-state imaging device 100.

Third Specific Example

Here, the operation of the A/D conversion circuit 109 provided in the solid-state imaging device 100 according to the second embodiment will be described. In the third specific example, the analog/digital conversion operation of the A/D conversion circuit 109 when the control circuit 107 evenly divides the ramp period into four periods (that is, the number of divisions n=4) will be described. In the third specific example, a case in which only the signal read period is evenly divided into four periods will be described in order to shorten the description.

Figure 6:
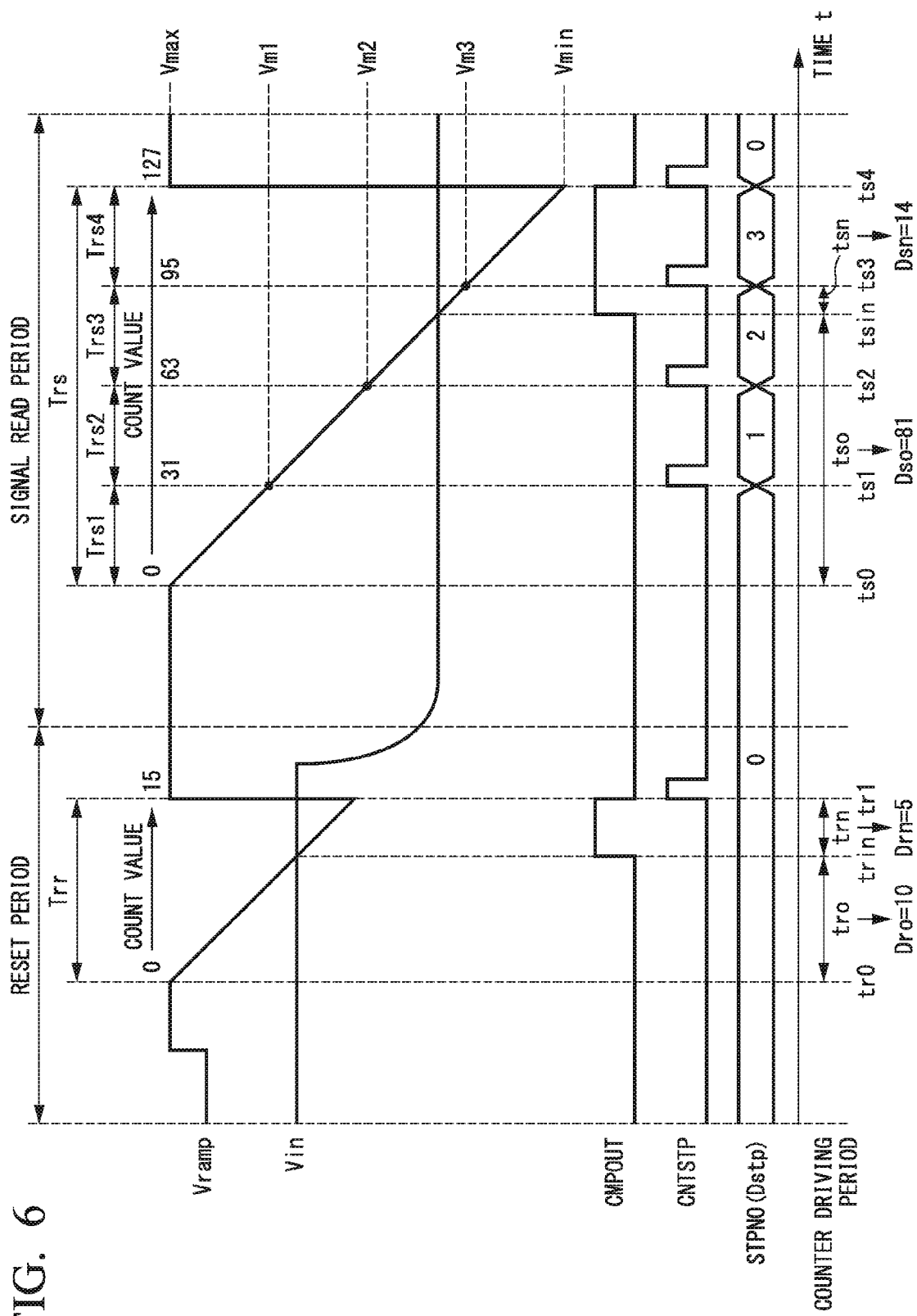
FIG. 6 is a timing chart showing a third specific example of an operation of an A/D conversion circuit provided in a solid-state imaging device according to a second embodiment of the present invention.

FIG. 6 is a timing chart showing the third specific example of the operation of the A/D conversion circuit 109 provided in the solid-state imaging device 100 according to the second embodiment. The timing chart of the third specific example shown in FIG. 6 is an example of a timing chart in which the potential difference between the maximum potential Vmax and the minimum potential Vmin of the analog signal Vin is evenly divided into four potentials by Vm1, Vm2, and Vm3 (Vm1=3×(Vmax+Vmin)/4, Vm1=3×(Vmax+Vmin)/4, Vm3=(Vmax+Vmin)/4, and Vm3≤Vin<Vm2), and the potential of the analog signal Vin in the signal read period is between the potential Vm3 and the potential Vm2.

The potential of the analog signal Vin in the timing chart of the third specific example shown in FIG. 6 is the same potential as the potential of the analog signal Vin of the first specific example of the solid-state imaging device 100 according to the first embodiment shown in FIG. 2. Thus, in the third specific example, the A/D conversion circuit 109 outputs a digital signal Dout having the same digital value as the first specific example of the solid-state imaging device 100 according to the first embodiment shown in FIG. 2.

FIG. 6 shows waveforms of the analog signal Vin and the ramp wave Vramp in one horizontal period of the solid-state imaging device 100 according to the second embodiment, the comparator output signal CMPOUT, and the count-stop signal CNTSTP and the stop position signal STPNO, similar to the timing chart of the first specific example of the solid-state imaging device 100 according to the first embodiment shown in FIG. 2. Moreover, FIG. 6 shows the driving period of the counter 13 provided in the A/D conversion circuit 109 and the driving period of the counter provided in the A/D conversion circuit 609 in the conventional solid-state imaging device 600 shown in FIG. 9, similar to the timing chart of the first specific example of the solid-state imaging device 100 according to the first embodiment shown in FIG. 2.

In the third specific example, as shown in FIG. 6, the number of clock cycles in the ramp period Trr between the time points tr0 and tr1 within the reset period is 15 (that is, the maximum value of the digital value in the ramp period Trr is 15). Moreover, the number of clock cycles in the ramp period Trs between the time points ts0 and ts2 in the signal read period is 127 (that is, the maximum value of the digital value in the ramp period Trs is 127).

The control circuit 107 evenly divides the ramp period Trs in the signal read period into four periods of a divided ramp period Trs1 between the time points ts0 and ts1, a divided ramp period Trs2 between the time points ts1 and ts2, a divided ramp period Trs3 between time points ts2 and ts3, and a divided ramp period Trs4 between time points ts3 and ts4. Moreover, as shown in FIG. 6, the control circuit 107 outputs a count-stop signal CNTSTP having a "High" level to the counter 13 in each A/D conversion circuit 109 provided in the column A/D conversion circuit 105 at the time at which each divided ramp period ends (that is, the time at which each of the divided ramp periods Trs1 to Trs4 ends).

Moreover, the control circuit 107 outputs a stop position signal STPNO configured to identify the respective divided ramp periods (that is, the divided ramp periods Trs1 to Trs4) to the memory 14 in each A/D conversion circuit 109 provided in the column A/D conversion circuit 105. In the third specific example, since the ramp period Trs is evenly divided into four periods (that is, the number of divisions n=4), the stop position signal STPNO is N bits of information (where $N=\log_2 n=\log_2 4=2$) as shown in FIG. 6.

In the third specific example shown in FIG. 6, since the count value when all periods of the ramp period Trs are counted is 127, a usual number of bits required for the counter is 7 bits. However, the counter 13 in the A/D conversion circuit 109 provided in the solid-state imaging device 100 according to the second embodiment counts the time in any one of the divided ramp periods of the ramp period Trs divided by the control circuit 107 as described above. That is, in the third specific example shown in FIG. 6, the counter 13 counts the time in one divided ramp period among the divided ramp periods (the divided ramp periods Trs1 to Trs4) obtained by the control circuit 107 evenly dividing the ramp period Trs into four periods. Thus, the number of bits of the counter 13 in the A/D conversion circuit 109 provided in the solid-state imaging device 100 according to the second embodiment is 5 bits by being reduced by 2 bits which is the number of bits N of the stop position signal STPNO output by the control circuit 107. That is, the number of bits of the counter 13 in the A/D conversion circuit 109 provided in the solid-state imaging device 100 according to the second embodiment can be further reduced by one bit from the number of bits of the counter 13 in the A/D conversion circuit 109 provided in the solid-state imaging device 100 according to the first embodiment. Thus, the maximum count value of the divided ramp period counted by the counter 13 is 31.

In the analog/digital conversion operation of the A/D conversion circuit 109 provided in the solid-state imaging device 100 according to the second embodiment, first, the comparator 12 performs a process (comparison process) of comparing the potential of the analog signal Vin with a reset level input from the analog signal processing circuit 103 and the potential of the ramp wave Vramp input from the DAC 104 from the time point tr0 which is the starting time of the ramp period Trr in the reset period, similar to the first specific example of the solid-state imaging device 100 according to the first embodiment shown in FIG. 2. The comparator 12 outputs the comparator output signal CMPOUT having a "High" level to the counter 13 and the memory 14 from a time point trin at which the potential of the ramp wave Vramp becomes equal to or lower than the potential of the analog signal Vin with the reset level.

The counter 13 starts counting time from the time point trin at which the comparator output signal CMPOUT is input in the ramp period Trr and stops counting of time at the time point tr1 at which the count-stop signal CNTSTP is input from the control circuit 107, similar to the first specific example of the solid-state imaging device 100 according to the first embodiment shown in FIG. 2. In this manner, the counter 13 counts the number of reference clock signals (the number of clock cycles) in a period trn shown in FIG. 6 to obtain a digital value corresponding to the magnitude (that is, the value of the reset signal of the pixel 11) of the analog signal Vin with a reset level input from the analog signal processing circuit 103. FIG. 6 shows a case in which a digital value Drn=5 is obtained as a digital value Drn indicating the magnitude of the analog signal Vin with the reset level.

In the operation of the conventional A/D conversion circuit 609, the number of the reference clock signals (the number of clock cycles) in a period tro between the time points tr0 and trin shown in FIG. 6 is counted, and a digital value Dro=10 is obtained as a digital value Dro indicating the magnitude of the analog signal Vin with a reset level.

Subsequently, in the analog/digital conversion operation of the A/D conversion circuit 109 provided in the solid-state imaging device 100 according to the second embodiment, in the signal read period, the comparator 12 performs a process (comparison process) of comparing the potential of the analog signal Vin with a reset+signal level input from the analog signal processing circuit 103 and the potential of the ramp wave Vramp input from the DAC 104 from the time point ts0 which is the starting time of the ramp period Trs, similar to the first specific example of the solid-state imaging device 100 according to the first embodiment shown in FIG. 2. Moreover, the comparator 12 outputs a comparator output signal CMPOUT having the "High" level to the counter 13 and the memory 14 from the time point tsin at which the potential of the ramp wave Vramp becomes equal to or lower than the potential of the analog signal Vin with the reset+signal level.

The counter 13 starts counting of time from the time point tsin at which the comparator output signal CMPOUT is input in the ramp period Trs. That is, in the third specific example, the counter 13 starts counting of time after the divided ramp period Trs3 starts. After that, the counter 13 stops counting of time at the time point ts3 at which the count-stop signal CNTSTP is first input from the control circuit 107 after the counting of time starts. In this manner, the counter 13 counts the time (counts the number of clock cycles) of the period tsn in the divided ramp period Trs3 shown in FIG. 6 to obtain a digital value corresponding to the magnitude (that is, the sum of the value of the reset signal of the pixel 11 and the value of the pixel signal) of the analog signal Vin with the reset+signal level input from the analog signal processing circuit 103. FIG. 6 shows a case in which a digital value Dsn=14 is obtained as a digital value Dsn indicating the magnitude of the analog signal Vin with the reset+signal level.

In the operation of the conventional A/D conversion circuit 609, the number of reference clock signals (the number of clock cycles) in a period tso between the time points ts0 and tsin shown in FIG. 6 is counted to obtain a digital value Dso=81 as a digital value Dso indicating the magnitude of the analog signal Vin with the reset+signal level.

After that, similar to the first specific example of the solid-state imaging device 100 according to the first embodiment shown in FIG. 2, the counter 13 performs a digital CDS process based on the digital value Drn and the digital value Dsn obtained in the reset period and the signal read period, respectively, to calculate a digital value Dcnt corresponding to the magnitude of the analog signal Vin input to the A/D conversion circuit 109 and outputs the calculated digital value Dcnt to the memory 14. In the example shown in FIG. 6, since the digital value Drn=5 and the digital value Dsn=14, the counter 13 calculates a digital value Dcnt such as is shown in Equation (10) below and outputs the digital value Dcnt to the memory 14.

$$Dcnt=Drn-Dsn=5-14=-9 \tag{10}$$

In this manner, the memory 14 stores the digital value Dcnt input from the counter 13, similar to the first specific example of the solid-state imaging device 100 according to the first embodiment shown in FIG. 2. Moreover, the memory 14 stores two bits of information of the stop position signal STPNO input from the control circuit 107 as a stop signal value Dstp at the time point tsin at which the comparator output signal CMPOUT is input, similar to the first specific example of the solid-state imaging device 100 according to the first embodiment shown in FIG. 2. In the example shown in FIG. 6, a stop signal value Dstp=2 is stored.

Moreover, similar to the first specific example of the solid-state imaging device 100 according to the first embodiment shown in FIG. 2, the memory 14 outputs the stored digital value Dcnt and stop signal value Dstp to the decoder 110 as a digital value Do generated by the A/D conversion circuit 109, corresponding to the magnitude of the analog signal Vin input from the analog signal processing circuit 103.

The decoder 110 determines an offset value Doff for correcting the digital value Dcnt according to Equation (2) based on the stop signal value Dstp included in the digital value Do input from the A/D conversion circuit 109, similar to the first specific example of the solid-state imaging device 100 according to the first embodiment shown in FIG. 2. In the example shown in FIG. 6, the digital value Dsmax=127, the digital value Drmax=15, and the number of divisions n=4 are all obtained. Moreover, in the example shown in FIG. 6, the stop signal value Dstp=2 is obtained. Thus, the decoder 110 calculates an offset value Doff such as is shown in Equation (11).

$$Doff=(127+1)\times(2+1)/4-(15+1)=128\times3/4-16=80 \tag{11}$$

As described above, the offset value Doff may be calculated in advance for each stop signal value Dstp. For example, in the example shown in FIG. 6, offset values Doff such as are shown in FIG. 7 corresponding to the respective stop signal values Dstp may be calculated in advance. Moreover, as described above, the respective offset values Doff calculated in advance may be set or stored as a table of the decoder 110.

Moreover, similar to the first specific example of the solid-state imaging device 100 according to the first embodiment shown in FIG. 2, the decoder 110 adds the determined offset value Doff to the digital value Dcnt included in the digital value Do input from the A/D conversion circuit 109 and outputs a sum as a digital signal Dout converted by the A/D conversion circuit 109, corresponding to the amount of light incident on the pixel 11. In the example shown in FIG. 6, a digital signal Dout such as is shown in Equation (12) below is output as the digital signal Dout.

$$Dout=Dcnt+Doff=-9+80=71 \tag{12}$$

In the operation of the conventional A/D conversion circuit 609, since the digital value Dso=81 and the digital value Dro=10, a digital signal Dout such as is shown in Equation (13) below is output by the digital CDS process of the data processing circuit 63.

$$Dout=Dso-Dro=81-10=71 \tag{13}$$

In this manner, the A/D conversion circuit 109 provided in the solid-state imaging device 100 according to the second embodiment outputs the same digital signal Dout as the output result of the conventional A/D conversion circuit 609 by the operation indicated by the third specific example.

The analog/digital conversion operation of converting the analog signal Vin having a different potential by the A/D conversion circuit 109 provided in the solid-state imaging device 100 according to the second embodiment can be considered similarly to the operations of the first and second specific examples of the solid-state imaging device 100 according to the first embodiment shown in FIGS. 2 and 4 and the third specific example shown in FIG. 6. Thus, a detailed description thereof will be omitted.

In this way, in the solid-state imaging device 100 according to the second embodiment, the control circuit 107 can reduce the number of bits of the counter 13 provided in the A/D conversion circuit 109 in the solid-state imaging device 100 according to the second embodiment by dividing the predetermined ramp period Trs into a plurality of n divided ramp periods. In this way, in the solid-state imaging device 100 according to the second embodiment, the driving period of the counter 13 when the potential of the analog signal Vin in the signal read period is lower than the potential Vm1 (Vin<Vm1) can be controlled to be equal to or shorter than the driving period of the counter provided in the data processing circuit 63 in the A/D conversion circuit 609 of the conventional solid-state imaging device 600. In this way, in the solid-state imaging device 100 according to the second embodiment, it is possible to reduce the circuit size of the solid-state imaging device 100 itself and to reduce the power consumption of the counter 13 provided in the A/D conversion circuit 109 in the solid-state imaging device 100. More specifically, in the operation when the potential of the analog signal Vin in the signal read period is lower than the potential Vm1 (Vin<Vm1), since the driving period (that is, the period tsn) of the counter 13 is equal to or shorter than the driving period (that is, the period tso) of the counter 13 in the operation of the conventional A/D conversion circuit 609, it is possible to reduce the power consumption of the counter 13.

Figure 8:
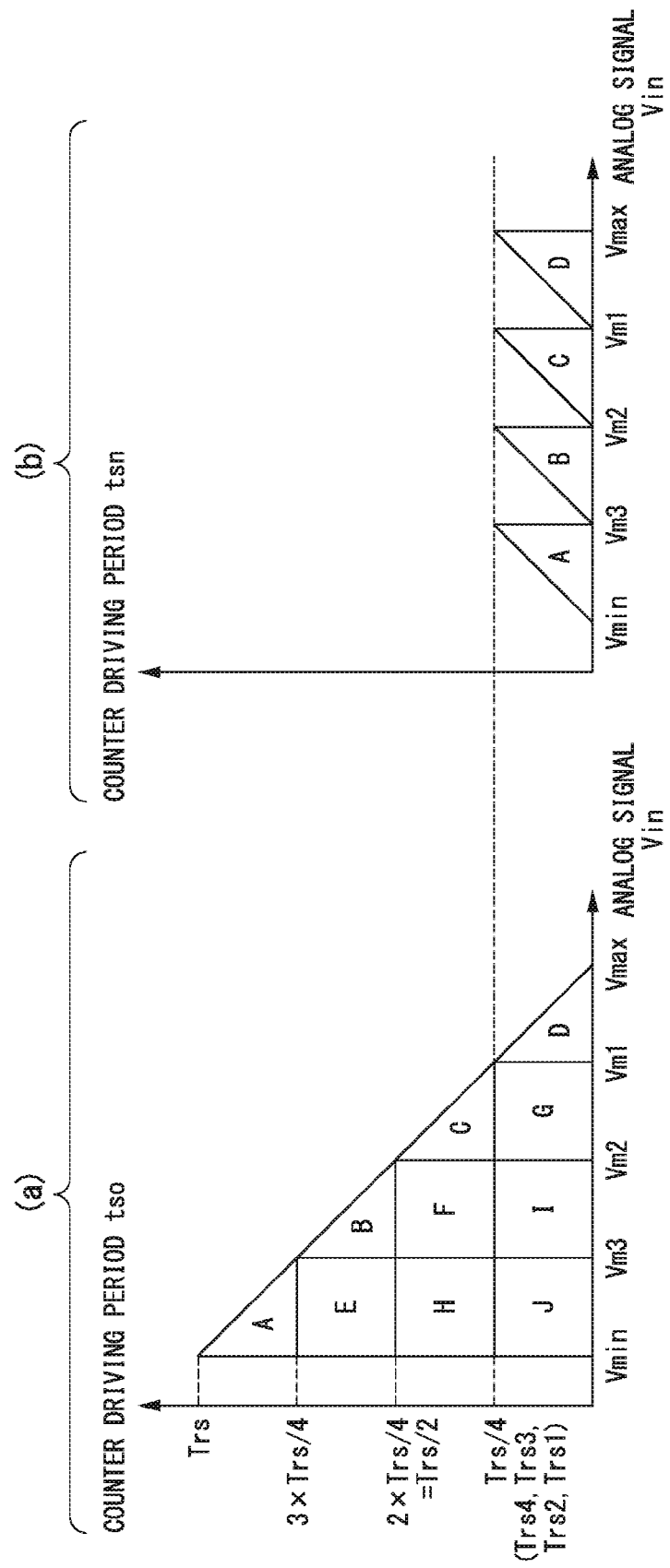
FIG. 8 is a diagram showing the relationship between a driving period of a counter and an analog signal input to the A/D conversion circuit provided in the solid-state imaging device according to the second embodiment.

Here, the power consumption of the counter 13 provided in the A/D conversion circuit 109 in the solid-state imaging device 100 according to the second embodiment will be described. FIG. 8 is a diagram showing the relationship between the driving period of the counter and the analog signal Vin input to the A/D conversion circuit 109 provided in the solid-state imaging device 100 according to the second embodiment. FIG. 8 shows the driving period of the counter when the potential of the analog signal Vin in the signal read period, input to the A/D conversion circuit 109 provided in the solid-state imaging device 100 according to the second embodiment, is uniformly distributed from the minimum potential Vmin to the maximum potential Vmax in the operation of the A/D conversion circuit 109 provided in the solid-state imaging device 100 according to the second embodiment as shown in the third specific example. FIG. 8(*a*) shows the relationship between the driving period tso of the counter and the analog signal Vin in the conventional A/D conversion circuit 609 and FIG. 8(*b*) shows the relationship between the driving period tsn of the counter and the analog signal Vin in the A/D conversion circuit 109 provided in the solid-state imaging device 100 according to the second embodiment.

As shown in FIG. 8(*a*), when an analog signal Vin uniformly distributed from the minimum potential Vmin to the maximum potential Vmax is input to the conventional A/D conversion circuit 609, the driving period of the counter provided in the data processing circuit 63 in the A/D conversion circuit 609 is uniformly distributed from all periods of the ramp period Trs to the driving period=0. More specifically, the driving period of the counter when the potential of the analog signal Vin is the minimum potential Vmin becomes shorter from the ramp period Trs as the potential of the analog signal Vin becomes higher in the order of Vm3→Vm2→Vm1, and the driving period of the counter becomes 0 when the potential of the analog signal Vin reaches the maximum potential Vmax. Thus, the power consumption of the counter in the A/D conversion circuit 609 provided in the conventional solid-state imaging device 600 corresponds to the sum of the areas of the driving periods of the indicated regions A to J shown in FIG. 8(*a*).

However, in the solid-state imaging device 100 according to the second embodiment, as shown in FIG. 8(*b*), the control circuit 107 evenly divides the ramp period Trs into four periods by dividing the potential of the analog signal Vin at the positions of the potentials Vm3, Vm2, and Vm1, and the counter 13 provided in the A/D conversion circuit 109 counts the time in any one of the divided ramp periods. Thus, even when an analog signal Vin uniformly distributed from the minimum potential Vmin to the maximum potential Vmax is input to the A/D conversion circuit 109, the driving period of the counter 13 temporarily becomes 0 when the potential of the analog signal Vin reaches the potentials Vm3, Vm2, and Vm1 as shown in FIG. 8(*b*).

More specifically, the driving period of the counter 13 becomes longer as the potential of the analog signal Vin becomes higher from the time when the driving period of the counter is 0 when the potential of the analog signal Vin reaches the minimum potential Vmin, and the driving period of the counter 13 reaches the divided ramp period Trs4 when the potential of the analog signal Vin reaches the potential Vm3. After that, when the potential of the analog signal Vin becomes higher than the potential Vm3, the driving period of the counter 13 temporarily becomes 0. Further, the driving period of the counter 13 becomes longer again from the time when the driving period is 0 as the potential of the analog signal Vin increases. The driving period of the counter 13 becomes the divided ramp period Trs3 when the potential of the analog signal Vin reaches the potential Vm2. After that, when the potential of the analog signal Vin becomes higher than the potential Vm2, the driving period of the counter 13 temporarily becomes 0. Further, the driving period of the counter 13 becomes longer again from the time when the driving period is 0 as the potential of the analog signal Vin increases. The driving period of the counter 13 becomes the divided ramp period Trs2 when the potential of the analog signal Vin reaches the potential Vm1. After that, when the potential of the analog signal Vin becomes higher than the potential Vm1, the driving period of the counter 13 temporarily becomes 0. Further, the driving period of the counter 13 becomes longer again from the time when the driving period is 0 as the potential of the analog signal Vin increases. The driving period of the counter 13 becomes the divided ramp period Trs1 when the potential of the analog signal Vin reaches the maximum potential Vmax.

Thus, the power consumption of the counter 13 of the A/D conversion circuit 109 provided in the solid-state imaging device 100 according to the second embodiment corresponds to the sum of areas of the driving periods of the indicated regions A, B, C, and D shown in FIG. 8(*b*). As can be understood from comparison between FIG. 8(*a*) and FIG. 8(*b*), in the solid-state imaging device 100 according to the second embodiment, the power consumption is reduced by an amount corresponding to the areas of the driving periods of the counter indicated by regions E to J shown in FIG. 8(*a*). Here, the power consumption corresponding to the areas of the driving periods of the counter indicated by regions E to J correspond to ¾ of the power consumption of the conventional solid-state imaging device 600. That is, in the solid-state imaging device 100 according to the second embodiment, the power consumption of the counter 13 provided in each A/D conversion circuit 109 can be reduced to ¼ (that is, 1/n) of the conventional solid-state imaging device 600.

As described above, in the solid-state imaging device 100 according to the second embodiment, the predetermined ramp period Trs is divided into four divided ramp periods, and the counter 13 provided in the A/D conversion circuit 109 counts the time in any one of the divided ramp periods. In this way, the maximum count value that the counter 13 in the A/D conversion circuit 109 provided in the solid-state imaging device 100 according to the second embodiment counts in the respective divided ramp periods decreases, and the number of bits required for the counter 13 can be reduced by two bits (that is, $\log_2 n$ bit). As a result, in the solid-state imaging device 100 according to the second embodiment, it is possible to reduce the circuit size and area of the A/D conversion circuit 109 (more specifically, the counter 13) further than that of the solid-state imaging device 100 according to the first embodiment. In the solid-state imaging device 100 according to the second embodiment including a number of A/D conversion circuits 109 corresponding to the number of columns of the pixel array portion 102, it is possible to reduce the circuit size and area of the solid-state imaging device 100 itself.

Moreover, in the solid-state imaging device 100 according to the second embodiment, the driving period of the counter 13 in the A/D conversion circuit 109 becomes further shortened with the operation of the counter 13 provided in the A/D conversion circuit 109 counting the time in the divided ramp period and the reduction of the number of bits of the counter 13, and the power consumption of the counter 13 can be reduced further. In this way, it is possible to further reduce the power consumption of the A/D conversion circuit 109 (more specifically, the counter 13) provided in the solid-state imaging device 100 according to the second embodiment, and in the solid-state imaging device 100 according to the second embodiment including a number of A/D conversion circuits 109 corresponding to the number of columns of the pixel array portion 102, it is possible to reduce the power consumption of the solid-state imaging device 100 itself.

In the solid-state imaging device 100 according to the second embodiment, the number of bits of the digital signal Dout finally output, which decreases with the reduction of the number of bits of the counter 13 provided in the A/D conversion circuit 109, is corrected by the decoder 110 common to the respective A/D conversion circuits 109, similar to the solid-state imaging device 100 according to the first embodiment. Due to this, in the solid-state imaging device 100 according to the second embodiment, it is possible to output the same digital value as a final digital signal Dout as the result of the conventional solid-state imaging device 600 in which the conventional A/D conversion circuit 609 is provided in the column A/D conversion circuit 605. Thus, it is possible to reduce the circuit size and area and to reduce the power consumption without deteriorating the performance of the solid-state imaging device 100.

As described above, according to the embodiments of the present invention, the predetermined ramp period in which the A/D conversion circuit provided in the solid-state imaging device performs analog/digital conversion is divided into a plurality of n divided ramp periods, and the counter provided in the A/D conversion circuit counts the time in any one of the divided ramp periods. In this way, in the embodiments of the present invention, it is possible to reduce the maximum count value that the counter provided in the A/D conversion circuit counts in each divided ramp period, and the number of bits required for the counter can be reduced by the number of bits of the logarithm of the number of divisions n in which the base is 2 (that is, $\log_2 n$). As a result, in the embodiments of the present invention, it is possible to reduce the circuit size and area particularly of the counter of the A/D conversion circuit. In the solid-state imaging device including a number of A/D conversion circuits corresponding to the number of columns of the pixel array portion, it is possible to reduce the circuit size and area of the solid-state imaging device itself.

Moreover, in the embodiments of the present invention, the driving period of the counter in the A/D conversion circuit becomes shorter with the operation of the counter provided in the A/D conversion circuit counting of time in the divided ramp period and with the reduction of the number of bits of the counter, the power consumption of the counter can be reduced. In this way, in the embodiments of the present invention, it is possible to reduce the power consumption particularly of the counter of the A/D conversion circuit. Moreover, in the solid-state imaging device including a number of A/D conversion circuits corresponding to the number of columns of the pixel array portion, it is possible to reduce the power consumption of the solid-state imaging device itself.

Moreover, in the embodiments of the present invention, the digital signal finally output is corrected by adding the offset value to the digital value which the counter, of which the number of bits is reduced, outputs, and the number of bits of the output digital signal is made to be the same as the number of bits of the digital signal that the conventional A/D conversion circuit outputs. In this way, in the embodiments of the present invention, it is possible to reduce the circuit size and area particularly of the counter of the A/D conversion circuit and to reduce the power consumption without deteriorating the performance of the A/D conversion circuit. Due to this, in the embodiments of the present invention, in the solid-state imaging device including a number of A/D conversion circuits corresponding to the number of columns of the pixel array portion, it is possible to output the same digital value as a final digital signal Dout as the result of the conventional solid-state imaging device in which the conventional A/D conversion circuit is provided in the column A/D conversion circuit. Thus, it is possible to reduce the circuit size and area and to reduce the power consumption without deteriorating the performance of the solid-state imaging device itself.

In the present embodiment, a case in which the DAC 104 generates a ramp wave Vramp of which the potential decreases (monotonously changes) with time at a certain rate has been described. However, the ramp wave Vramp generated by the DAC 104 is not limited to the embodiments of the present invention. For example, the idea of the present invention can be applied to a case in which the DAC 104 generates a ramp wave Vramp of which the potential increases (monotonously changes) with time at a certain rate. In this case, a method of calculating the offset value Doff according to the ramp wave Vramp generated by the DAC 104 is changed appropriately.

In the present embodiment a configuration of an up-counter that counts up when the counter 13 counts the time in the divided ramp period has been described. However, the operation of the counter 13 counting time is not limited to the embodiments of the present invention. For example, the counter 13 may be a down-counter that counts down when counting time and may be an up-down counter that counts up or counts down depending on a condition. In this case, a method of calculating the offset value Doff according to the operation of the counter 13 is changed appropriately.

In the present embodiment, in the description of the analog/digital conversion operation of the A/D conversion circuit 109, a case in which the control circuit 107 divides the ramp period Trs in the signal read period into n periods (more specifically, two or four periods) has been described. However, the period divided by the control circuit 107 is not limited to the embodiments of the present invention. For example, the ramp period Trr in the reset period may be divided into a number of m (where, m is an integer of 2 or more) periods, and at the ending timing of each divided ramp period, a count-stop signal CNTSTP configured to stop the counting of time, performed when the A/D conversion circuit 109 performs analog/digital conversion on the analog signal Vin with a reset level may be output to the counter 13 in the A/D conversion circuit 109. In this way, the power consumption of the counter 13 in the reset period can be reduced. In the solid-state imaging device 100 including a number of A/D conversion circuits 109 corresponding to the number of columns of the pixel array portion 102, it is possible to further reduce the power consumption of the solid-state imaging device 100 itself. In this case, the method of calculating the offset value Doff is changed appropriately according to the number of divisions m of the ramp period Trr in the reset period and the number of divisions n of the ramp period Trs in the signal read period.

In the present embodiment, a configuration in which the decoder 110 determines the offset value Doff and calculates the final digital signal Dout based on the digital value Dcnt input from the memory 14 and the digital value Do including the stop signal value Dstp has been described. However, the constituent element that determines the offset value Doff and calculates the final digital signal Dout is not limited to the embodiments of the present invention. For example, the counter 13 or the memory 14 provided in each A/D conversion circuit 109 may determine the offset value Doff and calculate the final digital signal Dout.

In the present embodiment, a case in which the A/D conversion circuit 109 calculates the offset value Doff based on the maximum digital value Dsmax in the predetermined ramp period Trs, the maximum digital value Drmax in the ramp period Trr, and the stop signal value Dstp has been described. However, a method of calculating the offset value Doff is not limited to the embodiments of the present invention. For example, the offset value Doff may be calculated using the maximum digital value in each divided ramp period. More specifically, a method of calculating the same offset value Doff as the offset value Doff calculated according to Equation (2) according to Equation (14) below using the maximum digital value in the divided ramp period as a digital value Ddmax may be considered.

$$D\text{off}=(Dd\text{max}+1)\times(D\text{stp}+1)-(Dr\text{max}+1) \quad (14)$$

That is, for example, in the third specific example, since the maximum count value in the divided ramp period counted by the counter 13 is 31, the offset value Doff calculated according to Equation (14) can be calculated as the same value as the offset value Doff calculated according to Equation (11) as shown in Equation (15) below.

$$D\text{off}=(31+1)\times(2+1)-(15+1)=32\times 3-16=80 \quad (15)$$

In the present embodiment, although a configuration in which the counter 13 performs the digital CDS process has been described, the constituent element that performs the digital CDS process is not limited to the embodiments of the present invention. For example, the memory 14 may perform the digital CDS process based on the digital value Drn in the reset period input from the counter 13 and the digital value Dsn in the signal read period.

In the present embodiment, a configuration in which the final digital signal Dout is calculated by adding the offset value Doff calculated by the decoder 110 to the digital value Dcnt on which the digital CDS process has been performed by the counter 13 has been described. However, the position to which the offset value Doff is applied is not limited to the embodiments of the present invention. For example, the offset value in the reset period and the offset value in the signal read period may be calculated. Moreover, the corresponding offset values may be applied to the digital value Drn indicating the magnitude of the analog signal Vin with the reset level counted by the counter 13 in the reset period and the digital value Dsn indicating the magnitude of the analog signal Vin with the reset+signal level counted by the counter 13 in the signal read period, and after that, the digital CDS process may be performed.

In the present embodiment an example of the configuration of the solid-state imaging device 100 in which the analog signal processing circuit 103 amplifies the pixel signal obtained by removing noise from the pixel signal input from the pixel array portion 102 and outputs the amplified pixel signal to the column A/D conversion circuit 105 as the analog signal Vin has been described. However, the configuration of the solid-state imaging device is not limited to the embodiments of the present invention. For example, the idea of the present invention can be applied to a solid-state imaging device in which the pixel array portion 102 removes noise from a pixel signal, amplifies the pixel signal, and outputs the pixel signal to the column A/D conversion circuit 105 as the analog signal Vin.

In the present embodiment, although the solid-state imaging device 100 in which the A/D conversion circuits 109 are disposed in each column of the pixel array portion 102 has been described, the arrangement of the A/D conversion circuits in the solid-state imaging device is not limited to the embodiments of the present invention. For example, one A/D conversion circuit may be disposed in a plurality of columns of the pixel array portion.

While preferred embodiments of the invention have been described and illustrated above, it should be understood that these are exemplary of the invention and are not to be considered as limiting. Additions, omissions, substitutions, and other modifications can be made without departing from the scope of the present invention.

What is claimed is:

1. An analog/digital converter comprising:
   a ramp signal generation circuit configured to generate a ramp signal of which potential monotonously changes with time at a certain rate;
   a comparison circuit configured to compare potential of an input analog signal with potential of the ramp signal, and to output a comparator output signal indicating that a predetermined condition is satisfied if the potential of the ramp signal satisfies the predetermined condition in relation to the potential of the analog signal;
   a count control circuit configured to divide a predetermined ramp period in which the ramp signal generation circuit outputs the ramp signal into a predetermined number n of divided ramp periods (where n is an integer of 2 or more), and to output a count-stop signal for stopping counting of time in each of the divided ramp periods;
   a counter circuit configured to count time in the divided ramp period from a time when the comparator output signal is input to a time when the count-stop signal is first input, and to output a count value of the counted time; and
   a decoder circuit configured to generate a digital signal corresponding to the input analog signal according to a digital value corresponding to the count value and a digital value corresponding to any one of the divided ramp periods in which the counter circuit has started counting of time, and to output the generated digital signal.

2. The analog/digital converter according to claim 1, wherein
   the digital value corresponding to the count value is a digital value obtained by decoding the count value, and
   the digital value corresponding to any one of the divided ramp periods in which the counter circuit has started counting of time is an offset value corresponding to a digital value obtained by decoding a count value of a time counted from a time when the counter circuit has started counting of time to a time when the ramp period ends.

3. The analog/digital converter according to claim 2, wherein
   the offset value is a digital value calculated based on the number of divisions n, information indicating a divided ramp period in which the counter circuit has started counting of the time, and a digital value obtained by decoding the count value obtained by counting of time in all periods of the ramp period.

4. The analog/digital converter according to claim 3, wherein
   the number of divisions n is a power of 2, and
   the information indicating the divided ramp period in which the counter circuit has started counting of time is a digital value of the number of bits that is a base 2 logarithm of the number of divisions n.

5. The analog/digital converter according to claim 4, wherein
   the number of divisions n is 2, and
   the information indicating the divided ramp period in which the counter circuit has started counting of time is a digital value of one bit.

6. A solid-state imaging device comprising:
a pixel array portion in which a plurality of pixels outputting a pixel signal corresponding to an amount of light incident thereon are disposed in a 2-dimensional matrix form; and
a plurality of the analog/digital converters according to claim 1 in which each analog/digital converter is disposed in each column or a plurality of columns of the pixel array portion so as to A/D-convert the pixel signals output in a reset period and a signal read period of the pixel,
wherein the comparison circuit and the counter circuit of the analog/digital converter are disposed in each column or a plurality of columns of the pixel array portion,
the ramp signal generation circuit of the analog/digital converter is disposed that is common to all comparison circuits,
the count control circuit of the analog/digital converter is disposed that is common to all counter circuit,
each of the plurality of comparison circuits receives the analog signal corresponding to the pixel signal output from the pixel in the corresponding column in each row of the pixel array portion and outputs the comparator output signal obtained by comparing the potential of the input analog signal and the potential of the ramp signal,
each of the plurality of counter circuits outputs the count values of the time counted in the divided ramp period from the time at which the comparator output signal is input from the corresponding comparison circuit to the time at which the count-stop signal is first input in each row of the pixel array portion, and
the decoder circuit generates, for each column of the pixel array portion, a digital signal corresponding to the analog signal according to a digital value corresponding to the count value output by the counter circuit and a digital value corresponding to any one of the divided ramp periods in which the counter circuit having output the count value has started counting of time, and sequentially outputs the generated digital signal in each column of the pixel array portion.

7. The solid-state imaging device according to claim 6, wherein
the decoder circuit of the analog/digital converter is disposed that is common to all counter circuits.

* * * * *